(12) United States Patent
Yoshida et al.

(10) Patent No.: US 6,750,478 B2
(45) Date of Patent: Jun. 15, 2004

(54) SEMICONDUCTOR LASER DEVICE AND METHOD FOR SUPPRESSING FABRY PEROT OSCILLATIONS

(75) Inventors: Junji Yoshida, Tokyo (JP); Naoki Tsukiji, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 86 days.

(21) Appl. No.: 10/252,880

(22) Filed: Sep. 24, 2002

(65) Prior Publication Data

US 2003/0063643 A1 Apr. 3, 2003

(30) Foreign Application Priority Data

Sep. 28, 2001 (JP) .......................... 2001-300566

(51) Int. Cl.[7] ........................... H01L 33/00; H01L 21/00
(52) U.S. Cl. ............................ 257/98; 257/13; 257/24; 257/103; 438/29; 438/32; 438/39; 438/46
(58) Field of Search ..................... 257/13, 24, 98, 257/99, 101, 103; 438/29, 32, 36, 38, 39, 40, 42, 46

(56) References Cited

U.S. PATENT DOCUMENTS 5,373,173 A * 12/1994 Ohata et al. ................. 257/88
5,668,048 A * 9/1997 Kondo et al. ................. 438/46
5,783,845 A * 7/1998 Kondo et al. ................. 257/198
6,384,963 B2    5/2002 Ackerman et al.
6,399,966 B1 *  6/2002 Tsuda et al. ................. 257/103
6,501,154 B2 * 12/2002 Morita et al. ................. 257/628
6,586,779 B2 *  7/2003 Tsuda et al. ................. 257/103
6,617,607 B2 *  9/2003 Ito et al. ...................... 257/22

FOREIGN PATENT DOCUMENTS

JP          07-015080           1/1995

* cited by examiner

Primary Examiner—Kevin M. Picardat
(74) Attorney, Agent, or Firm—Oblon, Spivak, McClelland, Maier & Neustadt, P.C.

(57) ABSTRACT

A semiconductor laser device includes an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along a portion of the length of the active layer and the laser device is configured to operate as a multiple mode oscillation device. A window structure is provided between an end of the active layer and one of the light reflecting and light emitting facets, and the window structure is configured to reduce a reflectivity of the one of the light reflecting and light emitting facets.

48 Claims, 16 Drawing Sheets

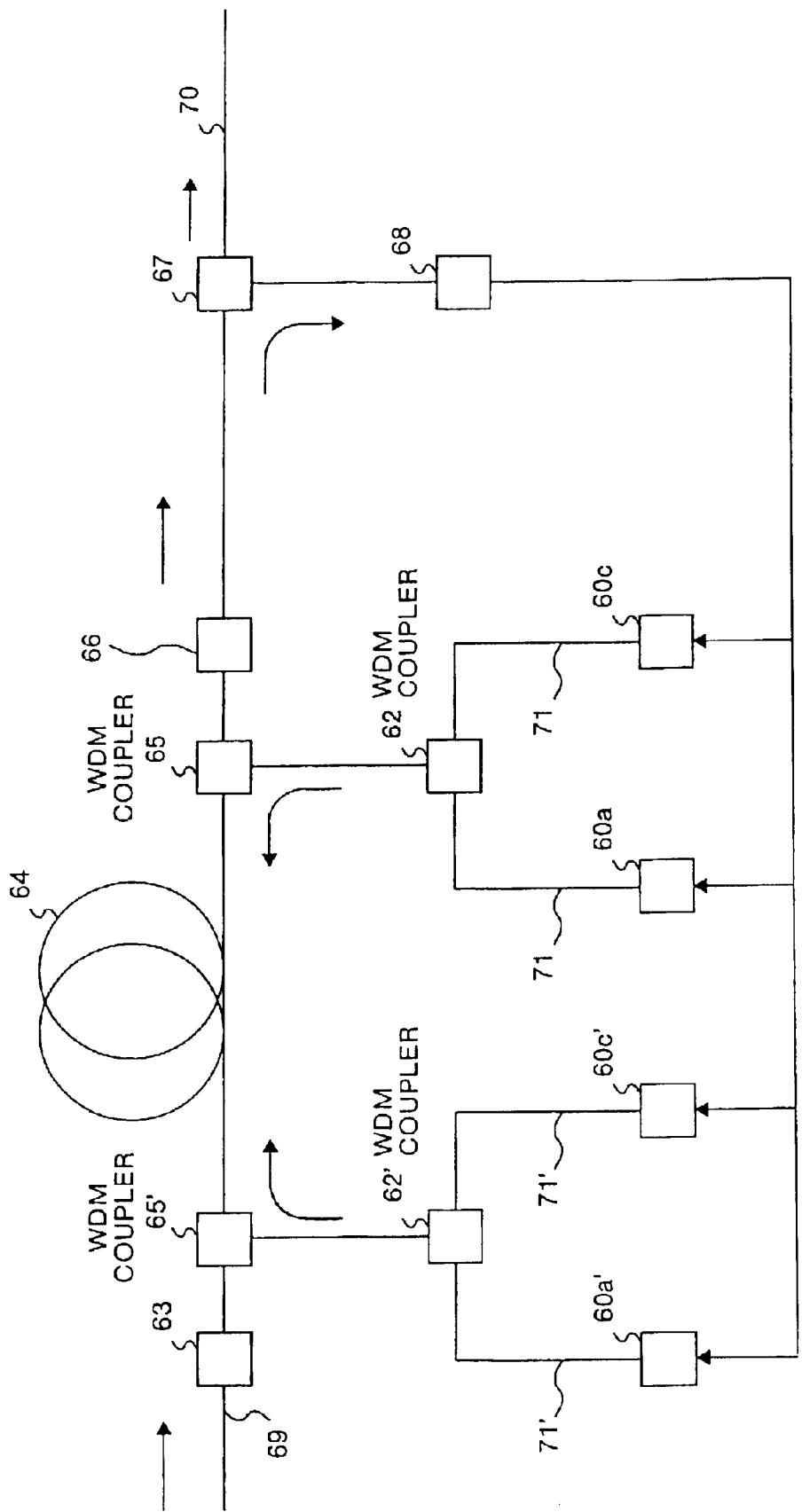

SEMICONDUCTOR LASER DEVICE AND METHOD FOR SUPPRESSING FABRY PEROT OSCILLATIONS

CROSS REFERENCE TO RELATED APPLICATIONS

This application includes subject matter related to U.S. patent application Ser. No. 09/832,885 filed Apr. 12, 2001; Ser. No. 09/983,175 filed on Oct. 23, 2001; and Ser. No. 09/983,249 filed on Oct. 23, 2001, assigned to The Furukawa Electric Co., Ltd. The entire contents of these applications are incorporated herein by reference.

FIELD OF THE INVENTION

The present invention relates generally to semiconductor laser device, and in particular to a semiconductor laser device used as a pumping source for an optical amplifier.

BACKGROUND OF THE INVENTION

With the proliferation of multimedia features on the Internet in the recent years, there has arisen a demand for larger data transmission capacity for optical communication systems. Conventional optical communication systems transmitted data on a single optical fiber at a single wavelength of 1310 nm or 1550 nm, which have reduced light absorption properties for optical fibers. However, in order to increase the data transmission capacity of such single fiber systems, it was necessary to increase the number of optical fibers laid on a transmission route, which resulted in an undesirable increase in costs.

In view of this, there has recently been developed wavelength division multiplexing (WDM) optical communications systems such as the dense wavelength division multiplexing (DWDM) system wherein a plurality of optical signals of different wavelengths can be transmitted simultaneously through a single optical fiber. These systems generally use an Erbium Doped Fiber Amplifier (EDFA) to amplify the data light signals as required for long transmission distances. WDM systems using EDFA initially operated in the 1550 nm band which is the operating band of the Erbium Doped Fiber Amplifier and the band at which gain flattening can be easily achieved. While use of WDM communication systems using the EDFA has recently expanded to the small gain coefficient band of 1580 nm, there has nevertheless been an increasing interest in an optical amplifier that operates outside the EDFA band because the low loss band of an optical fiber is wider than a band that can be amplified by the EDFA; a Raman amplifier is one such optical amplifier.

In a Raman amplifier system, a strong pumping light beam is pumped into an optical transmission line carrying an optical data signal. As is known to one of ordinary skill in the art, a Raman scattering effect causes a gain for optical signals having a frequency approximately 13TH smaller than the frequency of the pumping beam. The pumping wavelength is approximately 100 nm shorter than the signal wavelength, which is typically in the vicinity of 1500 nm. Where the data signal on the optical transmission line has this longer wavelength, the data signal is amplified. Thus, unlike an EDFA where a gain wavelength band is determined by the energy level of an Erbium ion, a Raman amplifier has a gain wavelength band that is determined by a wavelength of the pumping beam and, therefore, can amplify an arbitrary wavelength band by selecting a pumping light wavelength. Consequently, light signals within the entire low loss band of an optical fiber can be amplified with the WDM communication system using the Raman amplifier and the number of channels of signal light beams can be increased as compared with the communication system using the EDFA.

For the EDFA and Raman amplifiers, it is desirable to have a high output laser device as a pumping source. This is particularly important for the Raman amplifier, which amplifies signals over a wide wavelength band, but has relatively small gain. Such high output is generally provided by a pumping source having multiple longitudinal modes of operation. The Furukawa Electric Co., Ltd. has recently developed an integrated diffraction grating device that provides a high output multiple mode laser beam suitable for use as a pumping source in a Raman amplification system. An integrated diffraction grating device, as opposed to a fiber brag grating device, includes the diffraction grating formed within the semiconductor laser device itself. Examples of multiple mode oscillation integrated diffraction grating devices are disclosed in U.S. patent application Ser. No. 09/832,885 filed Apr. 12, 2001, Ser. No. 09/983,175 filed on Oct. 23, 2001, and Ser. No. 09/983,249 filed on Oct. 23, 2001, assigned to The Furukawa Electric Co., Ltd. and the entire contents of these applications are incorporated herein by reference.

As disclosed in the Ser. No. 09/832,885, 09/983,175, and 09/983,249 patent applications, a multiple longitudinal mode laser device having an integrated diffraction grating preferably has a low reflectivity at the light emitting facet of the laser device. As recognized by the present inventors, this low reflectivity of the light emitting facet of the laser device suppresses the Fabry-Perot oscillation of the device, thereby eliminating kinks in the current to light output (I-L) curve of the device and enhancing high output power operation. Such a low reflectivity is generally provided by an antireflective coating on the cleaved facet of the laser device. However, the present inventors have recognized that such antireflective coatings are difficult to produce due to limitations in thickness control of the coating process. Moreover, the present inventors have recognized that antireflective coating techniques are limited for producing very low reflectivity over the wide wavelength band.

SUMMARY OF THE INVENTION

Accordingly, one object of the present invention is to provide a laser device and method for providing a light source suitable for use as a pumping light source in a Raman amplification system, but which overcomes the above described problems.

Another object of the present invention is to provide a laser device having suppressed Fabry-Perot oscillations.

Yet another object of the present invention is to provide a laser device having a laser facet with a low reflectivity.

According to a first aspect of the present invention, a semiconductor device and method for providing a light source suitable for use as a pumping light source in a Raman amplification system are provided. The device upon which the method is based includes an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along the length of the active layer and the laser device is configured to output a multiple mode laser beam. At least one of the light reflecting and light emitting facets is vertically offset by an offset angle with respect to the light emitting direction of the laser device.

Either the light emitting facet or the light reflecting facet, or both the light emitting and light reflecting facets may be vertically offset to suppress Fabry-Perot oscillations. The light emitting facet and the light reflecting facet may be vertically offset by an offset angle 3° or more with respect to the light emitting direction. The light emitting facet and the light reflecting facet are preferably vertically offset such that an effective reflectivity Reff of the respective facet is less than 0.1%. Moreover, the light reflecting facet and/or the light emitting facet may include a reflectance coating.

According to another aspect of the invention, a semiconductor laser module, an optical amplifier, a Raman amplifier, or a wavelength division multiplexing system may be provided with a semiconductor laser device having an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along the length of the active layer. At least one of the light reflecting and light emitting facets is vertically offset by an offset angle with respect to the light emitting direction of the laser device so as to reduce the effective reflectivity of the facet and suppress Fabry-Perot oscillations.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 19 and 20 show a block diagram illustrating a configuration of the Raman amplifier used in a WDM communication system in a forward and bidirectional pumping method respectively, in accordance with the present invention;

DESCRIPTION OF THE PREFERRED EMBODIMENTS

Figure 1:
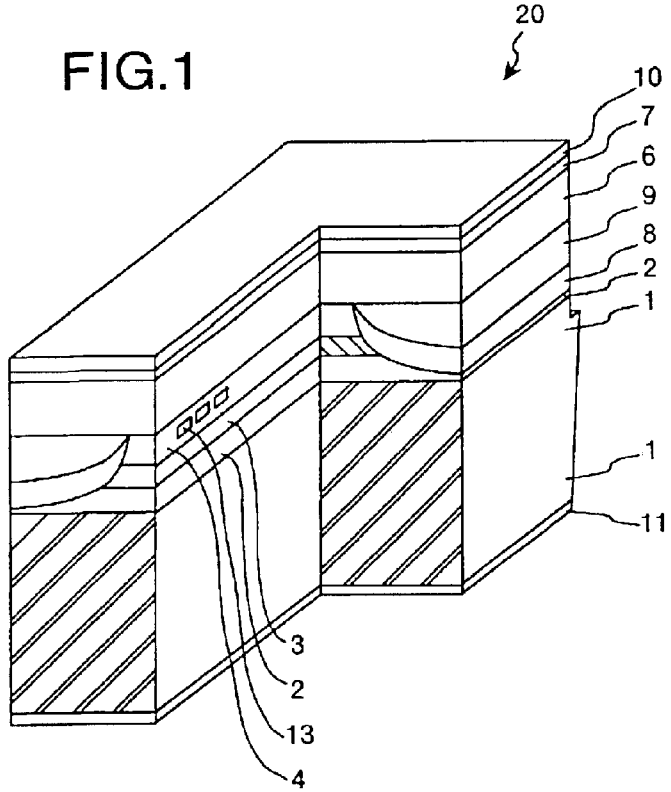
FIG. 1 is a cutaway view of a semiconductor laser device according to a first embodiment of the present invention.
Figure 2:
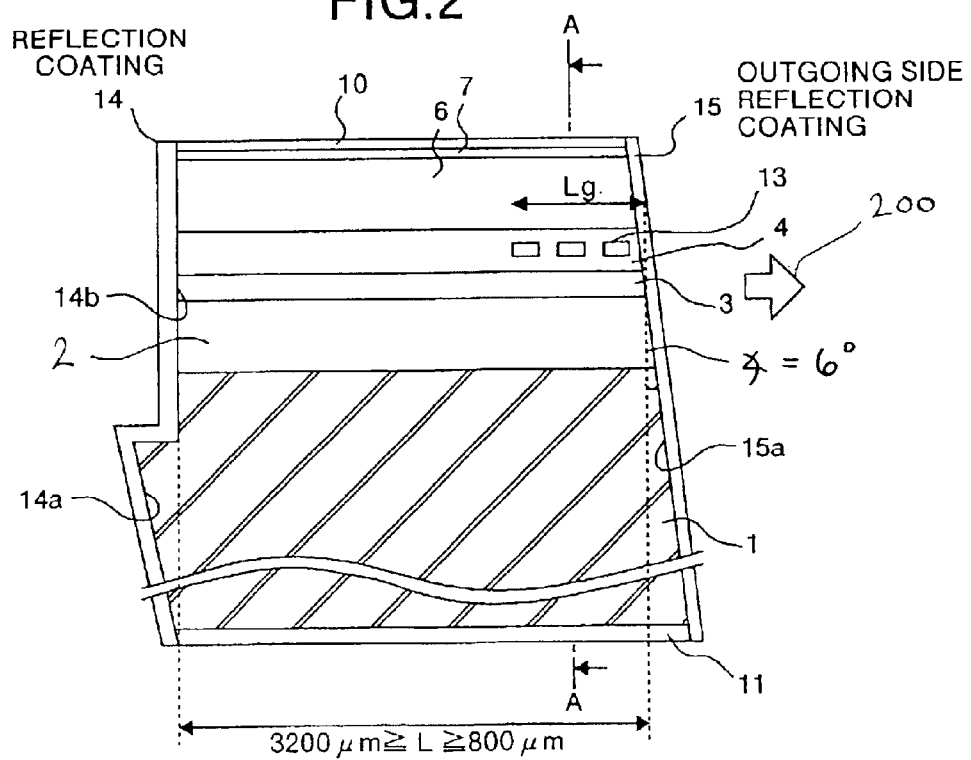
FIG. 2 is a vertical sectional view in the longitudinal direction of a semiconductor laser according to the first embodiment of the present invention.
Figure 3:
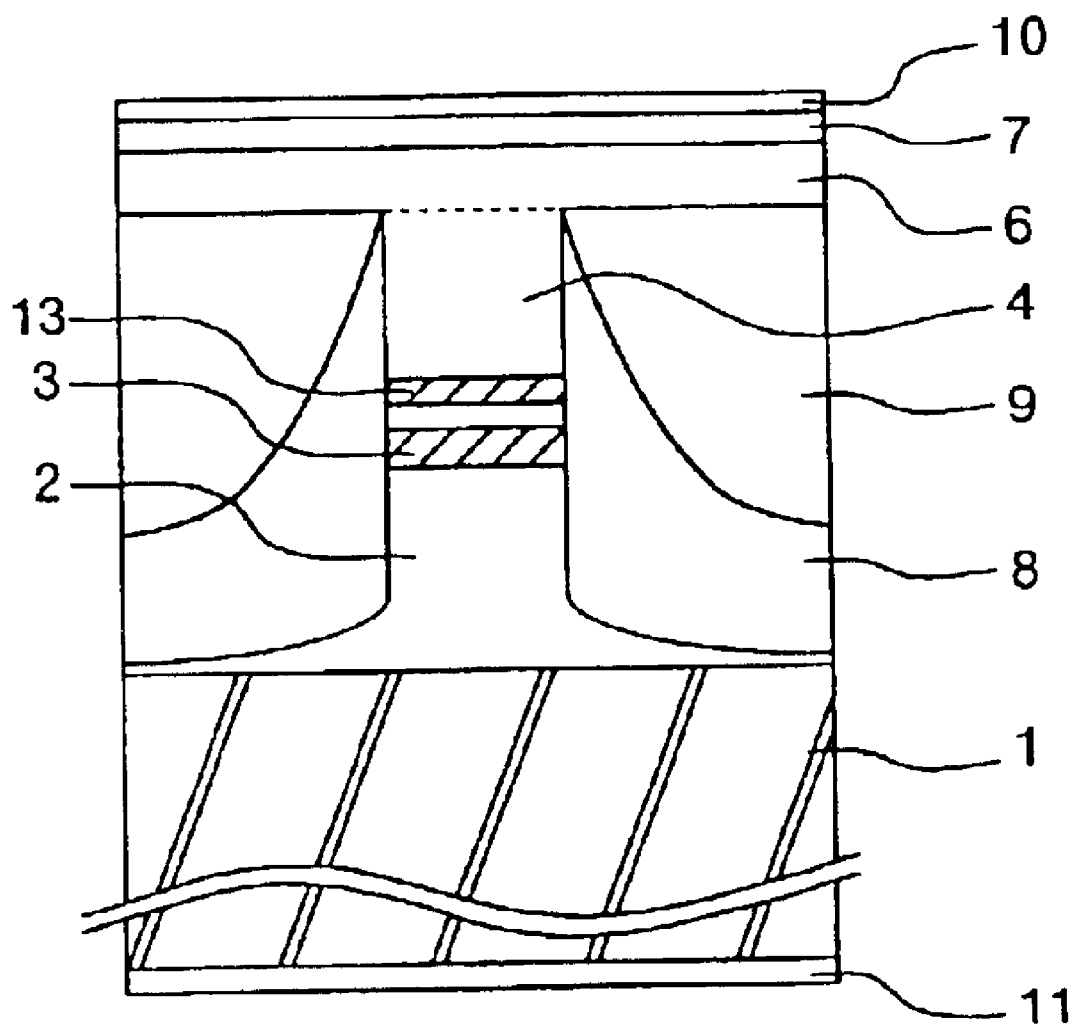
FIG. 3 is a cross sectional view along the line A—A of the semiconductor laser device shown in FIG. 2.

Referring now to the drawings wherein like elements are represented by the same reference designation throughout, and more particularly to FIGS. 1 through 3 thereof, there is shown a semiconductor laser device for providing a light source suitable for use as a pumping light source in a Raman amplification system, in accordance with a first embodiment of the present invention. FIG. 1 is a cutaway view of the semiconductor device, FIG. 2 is a vertical sectional view in the longitudinal direction of the semiconductor laser device, and FIG. 3 is a cross sectional view of the semiconductor laser device, taken along the line A—A in FIG. 2.

The semiconductor laser device 20 of FIGS. 1 through 3 includes an n-InP substrate 1 having an n-InP buffer layer 2, an active layer 3, a p-InP spacer layer 4, a p-InP cladding layer 6, and an p-InGaAsP contact layer 7 sequentially stacked on a face of the substrate 1. Buffer layer 2 serves both as a buffer layer by the n-InP material and an under cladding layer, while the active layer 3 is a graded index separate confinement multiple quantum well (GRIN-SCH-MQW) structure. A diffraction grating 13 of a p-InGaAsP material is periodically formed within the p-InP spacer layer 4 along a portion of the entire length of active layer 3 to provide light reflecting properties in the laser cavity as will be further described below. Moreover, a (100) reference crystal plane of the n-InP substrate 1 is vertically offset by approximately 6° as will be further described below. Finally, a p-side electrode 10 is formed on the upper surface of InGaAsP cap layer 7, and an n-side electrode 11 is formed on the lower surface of n-InP substrate 1.

As seen in FIG. 2, a plane 15a formed by the light emitting end of the laser device is vertically offset with respect to a plane perpendicular to the longitudinal direction of the semiconductor laser device 20 along which light is emitted from the device as shown by the arrow 200. Moreover, on the light reflecting end of the laser device 20, the substrate 1 has a planar surface 14a substantially parallel to the offset planar surface 15a, while buffer layer 2, active layer 3, spacer layer 4, cladding layer 6, contact layer 7 and electrode form a planar surface substantially perpendicular to the light emitting direction of the laser device 20. In this regard, it is noted that the vertically offset planes 14a and 15a are achieved during the process of cleaving the laser device 20 from a semiconductor wafer. Specifically, the cleavage plane of a device generally corresponds to a crystal reference plane of the device. Therefore, because the (100) crystal plane of the substrate 1 is 6° offset from a plane perpendicular to the light output direction, the cleavage plane of the substrate, and the multilayer structure thereon, is 6° offset from a plane perpendicular to the light output as shown in FIG. 2.

As also seen in FIG. 2, a reflective film 14 having high reflectivity of, for example, 80% or more, and preferably 98% or more is formed on the light reflecting end surface of the semiconductor laser device 20. Antireflection coating 15 having a low reflectivity of, for example, less than 5%, less than 1%, or less than 0.5%, and most preferably less than 0.1% is formed on a light irradiating end surface opposing the light reflecting end surface of semiconductor laser device 20. It is also noted that the present invention is useful for laser devices having a light emitting facet with relatively high reflection coefficient of less than 30% or less than 10%, for example. The reflective film 14 and the antireflection coating 15 form an optical resonator within the active region 3 of the semiconductor laser device 20. However, the offset facet 15 greatly decreases the amount of light reflected from the light emitting facet and returning to the laser cavity. According to the present invention, the grating 13 provides reflectivity characteristics sufficient to sustain oscillations in the laser device and to provide a laser output. Specifically, a light beam generated inside the GRIN-SCH-MQW active layer 3 of the light resonator is oscillated between the reflective film 14 and the combination of the grating 13 and light emitting facet, and irradiated as an output laser beam via the antireflection coating 15. In this way, a specific wavelength spectrum is selected by the diffraction grating 13 as the laser output.

The laser device 20 of FIGS. 1–3 is constructed so as to provide multiple longitudinal mode oscillation of the laser device. Thus, as seen in FIG. 2, the resonator length L is preferably from 800–3200 μm as described in U.S. patent application Ser. No. 09/832,885, which is incorporated herein by reference. In the embodiment of FIGS. 1 through 3, the diffraction grating 13 has a length Lg of approximately 50 μm, grating layer thickness of 20 nm, a grating pitch of 220 nm, and selects a laser beam having a central wavelength of 1480 nm to be emitted by the semiconductor laser device 20. Moreover, as best seen in FIG. 3, the p-InP spacer layer 4 having the diffraction grating 13, the GRIN-SCH-MQW active layer 3, and the upper part of the n-InP buffer layer 2 are processed in a mesa stripe shape and the sides of the mesa stripe are buried by a p-InP blocking layer 8 and an n-InP blocking layer 9.

Thus, the semiconductor laser device of the first embodiment of the present invention provides a light reflecting facet that is substantially perpendicular to the light output direction and a light emitting facet that is 6° vertically offset from a plane perpendicular to the light output direction. The present inventors have discovered that a laser device having such a structure provides a stable and efficient output for multiple mode integrated diffraction grating devices. Specifically, light reflected from the offset facet becomes incident on the n-InP buffer layer 2/active layer 3 (or p-InP spacer layer 4/active layer 3) boundary at such an angle that the light is not reflected or guided within the active layer 3, but rather penetrates the boundary to be attenuated by the InP material. That is, due to the light emitting facet and film 15 being offset, any light that reaches this facet does not return to the GRIN-SCH-MQW active layer 3. Therefore, it is possible to make the total reflectance of the plane of cleavage 15a and the outgoing side reflection coating 15 to be less than 0.1%, and the light generated in the GRIN-SCH-MQW active layer 3 returns to the GRIN-SCH-MQW active layer 3 only by the diffraction grating 13. Accordingly, oscillation of the laser beam generated in the Fabry-Perot mode is suppressed, and the laser beam having a wavelength selected by the diffraction grating 13 is output efficiently. As a result, a kink in the injected current-laser output characteristic (IL characteristic) is eliminated, thereby enabling stable oscillation.

Figure 4A:
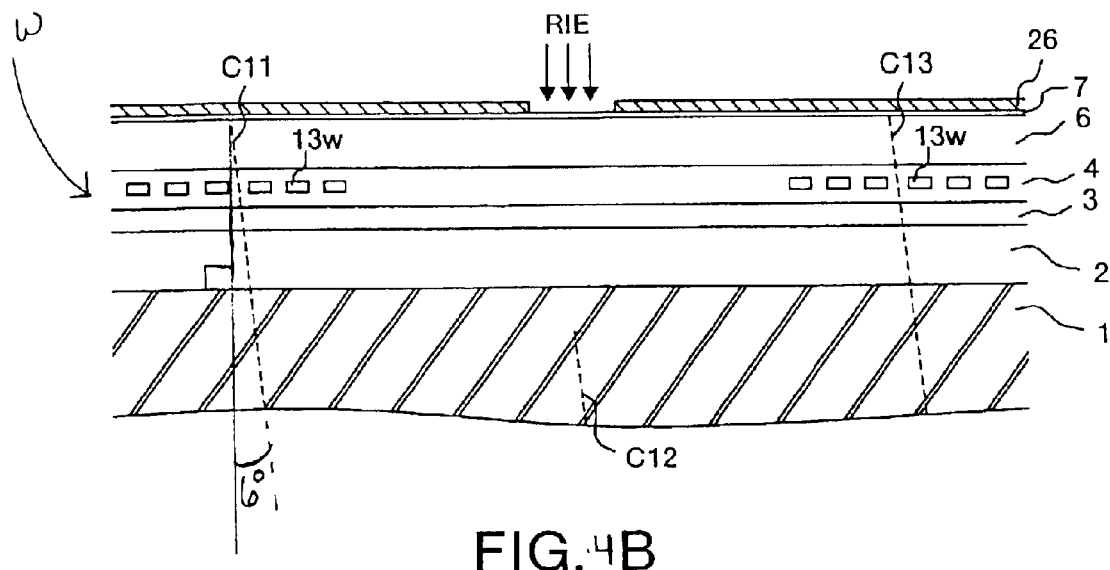
FIGS. 4A, 4B and 4C are semiconductor process views showing a method of collectively producing semiconductor laser devices of the first embodiment of the invention on a semiconductor wafer.
Figure 4B:
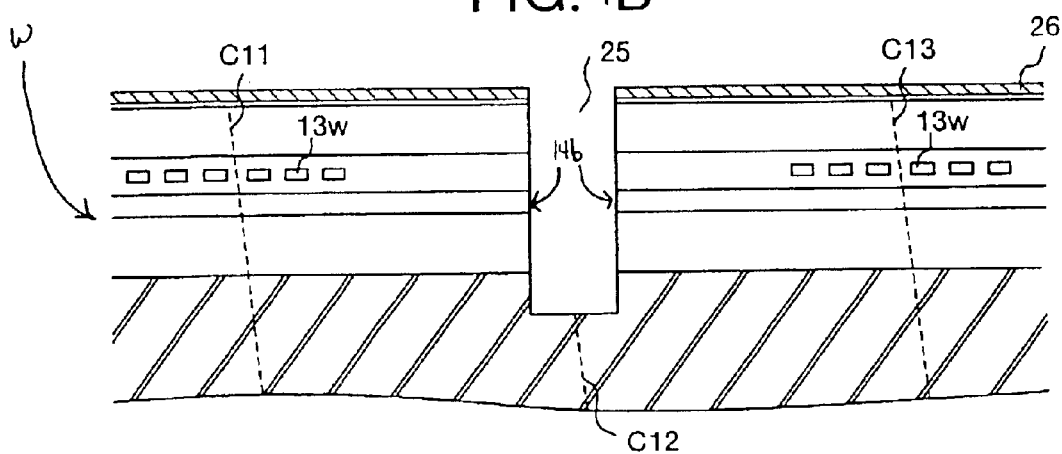
Figure 4C:
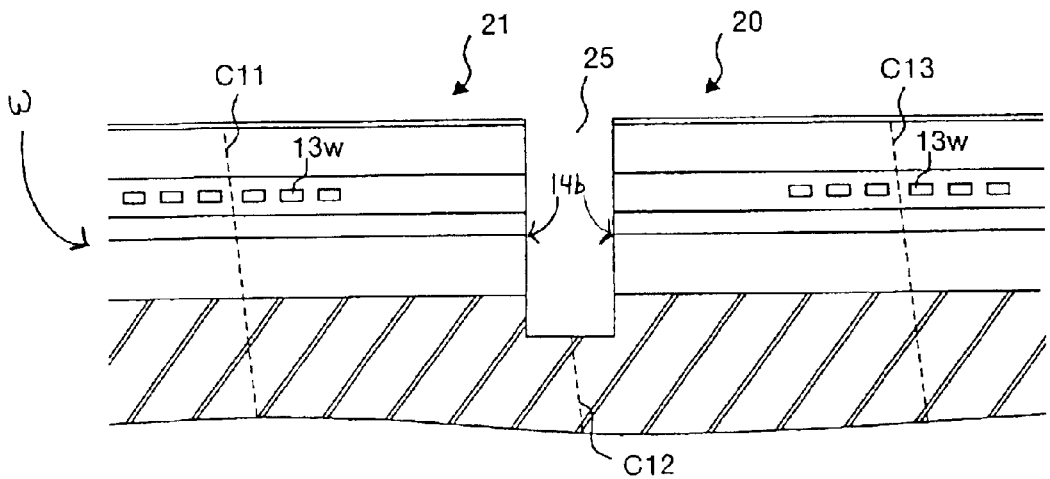

FIGS. 4A, 4B, and 4C illustrate a method of manufacturing a plurality of the semiconductor laser devices of the first embodiment on a single wafer W. As seen in FIG. 4A, the n-InP clad layer 2, the GRIN-SCH-MQW active layer 3 and the P-InP spacer layer 4 including the diffraction grating 13W are sequentially laminated on the face of the n-InP substrate 1. Because the multilayer structure formed on the substrate follows the crystalline structure of the substrate, the entire structure of the laser device follows the (100) plane of the substrate 1, which has an off axis of approximately 6 degrees. In this regard, it is noted that the off angle of the substrate is limited to the range of 3° or more but no more than 15° in accordance with this embodiment of the invention. This is because an off angle of more than 15° causes remarkable degradation of the semiconductor crystal, which degrades the optical characteristics. While not shown in FIGS. 4A–4C, the p-InP spacer layer 4 having the diffraction grating 13W, the GRIN-SCH-MQW active layer 3, and the upper part of the n-InP buffer layer 2 are processed in a mesa stripe shape and the sides of the mesa stripe are buried by a p-InP blocking layer 8 and an n-InP blocking layer 9 formed as current blocking layers. Thereafter, the cladding layer 6 and contact layer 7 are formed on top of the spacer layer and current blocking layer as shown in FIG. 4A.

After the multiple layers of the laser device are formed on the substrate 1, an SiN layer 26 is formed on the contact layer 7. This SiN layer 26 is etched, by reactive ion etching (RIE), for example, to form a mask for forming a vertical plane 14b on the reflection coating side 14 of the laser device. As seen in FIG. 4B, an RIE or wet etching process is made to etch through the contact layer 7, cladding layer 6, spacer layer 4, active layer 3 and clad layer 2 into the substrate 1. Thus, the depth of this etching area 25 reaches the upper part of the n-InP substrate 1. After the etched, area 25 is formed, the SiN layer 26 is removed as shown in FIG. 4C. As also seen in this figure, the etched area 25 deliniates semiconductor laser device 20 from semiconductor laser device 21, which will become discrete laser devices after the wafer on which the devices are formed is cleaved. With the SiN layer 26 is removed, a p-side electrode 10 and n-side electrode 11 are formed on the upper surface of the InGaAsP contact layer 7 and the lower surface of the substrate respectively. These electrodes are formed for each of the laser devices 20 and 21 using known techniques such as photolithography, EB deposition or the like.

As noted above, FIGS. 4A, 4B, and 4C, show the process of forming a plurality of semiconductor laser devices on a wafer W. Thus, once the devices are formed on the wafer as shown in FIG. 4C, the devices must be separated by cleaving the wafer along cleavage lines C11, C12, and C13. Since the substrate 1 and the multilayer structure thereon have a (100) plane that is 6° vertically offset from a plane perpendicular to the longitudinal direction (i.e. light output direction) of the device, the cleavage planes C11, C12, and C13 are offset 6° from a line perpendicular to the light output as illustrated by cleavage plane 11 in FIG. 4A. Moreover, the cleavage planes C11, C12, and C13 are located on the wafer W such that each plane substantially bisects either grating 13W or the etched area 25. Thus, the grating 13W and etched area 25 formed on the wafer w are each integral structures formed across a cleavage boundary of adjacent laser devices on the wafer W.

Figure 5:
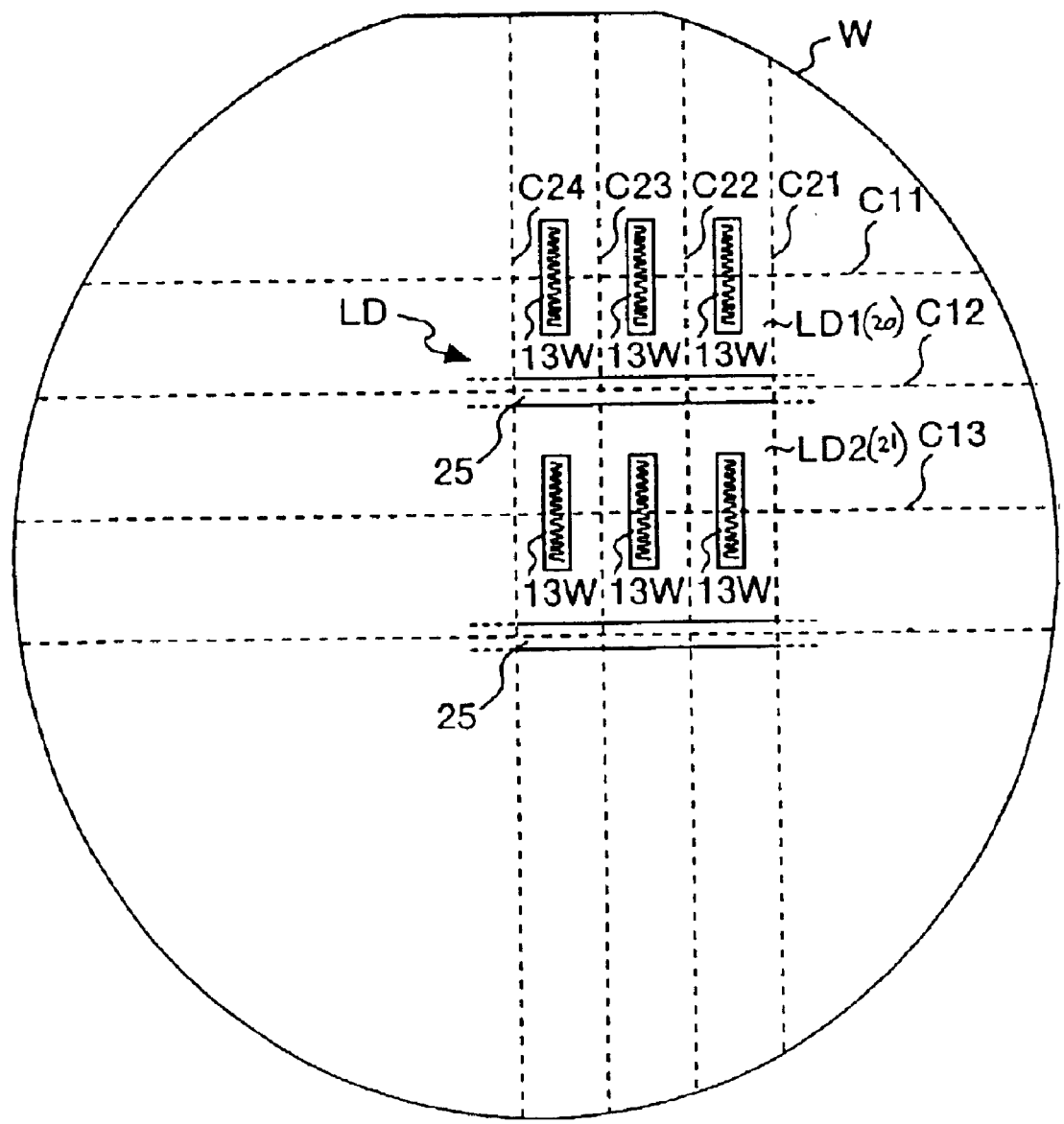
FIG. 5 is a plan view of a semiconductor wafer having formed thereon a plurality of the semiconductor laser devices having an offset facet according to the present invention.

FIG. 5 is a plan view of a semiconductor wafer having formed thereon a plurality of the semiconductor laser devices having an offset facet according to the present invention. The plurality of semiconductor laser devices are separated by cleavage boundaries where the devices on the wafer will be cleaved into discrete devices. As seen in FIG. 5, the grating 13W and etch area 25 are preferably formed as integral structures that cross the cleavage boundary between adjacent laser devices on the semiconductor wafer W. Thus, when the wafer w is cleaved along planes C11, C12, and C13, the discrete laser devices formed by the cleaving will have a portion of the grating 13w and a portion of the etched area 25. Thereafter, the reflection coating 14 and the outgoing side reflection coating 15 are formed with respect to the planes of cleavage C11 to C13 (14a, 15a) and the etching plane 14b, to thereby form the semiconductor laser device 20.

Figure 6:
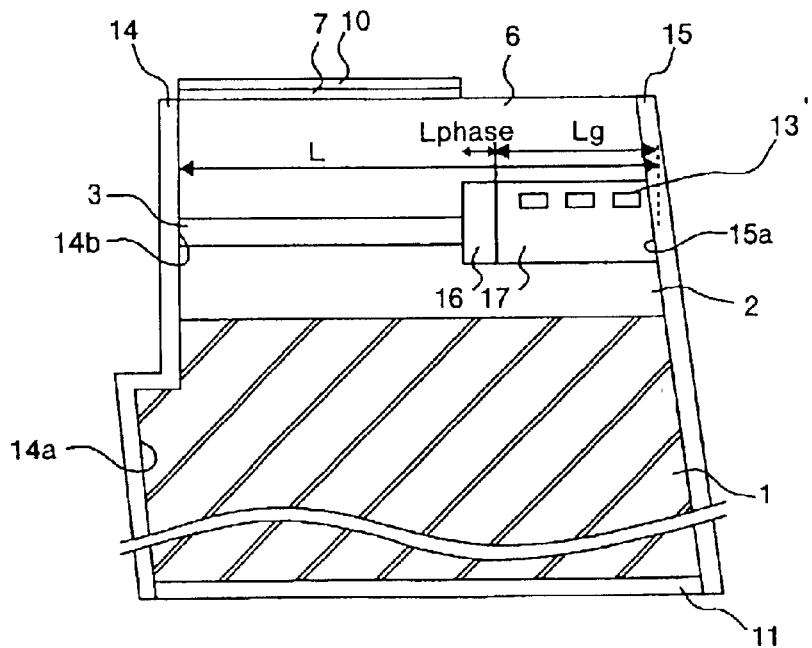
FIG. 6 is a vertical sectional view in the longitudinal direction of a semiconductor laser device according to a variation of the first embodiment of the present invention.

In the first embodiment described above, the semiconductor laser device is partially provided with the diffraction grating 13 along the GRIN-SCH-MQW active layer 3, but the invention is not limited to this structure. FIG. 6, shows a variation of the first embodiment of the present invention wherein the diffraction grating is formed along an optical waveguide of the semiconductor device. In the semiconductor laser device shown in FIG. 6, an optical waveguide layer 16 and an optical waveguide layer 17 including the diffraction grating are sequentially disposed in the longitudinal direction (laser beam emitting direction) from the GRIN-SCH-MQW active layer 3. As also seen in this figure, the front facet plane 15a and the film 15 formed thereon are offset with respect to a line perpendicular to the light output of the device as previously described. As a result, the effective reflectivity of the light emitting facet is reduced and unnecessary oscillation in the Fabry-Perot mode can be suppressed resulting in stable oscillation and an increase in laser output efficiency.

The first embodiment illustrates the present invention with reference to the diffraction grating 13 provided in the vicinity of the offset light emitting facet plane. With this configuration, it is preferable that the diffraction grating length Lg and the resonator length L are set to satisfy the relationship Lg×(1300 $\mu$m/L)≦300 $\mu$m. Moreover, the diffraction grating 13 is preferably constructed such that a value obtained by multiplying a coupling coefficient κ of the diffraction grating by a diffraction grating length Lg is set to 0.3 or less. Examples of devices having a diffraction grating provided in the vicinity of the radiation side reflecting film may be found in U.S. patent application Ser. No. 09/983, 249, which is incorporated herein by reference. It is to be understood, however, the present invention is not limited to devices having an offset plane diffraction grating provided in the vicinity of the offset light emitting facet.

Figure 7:
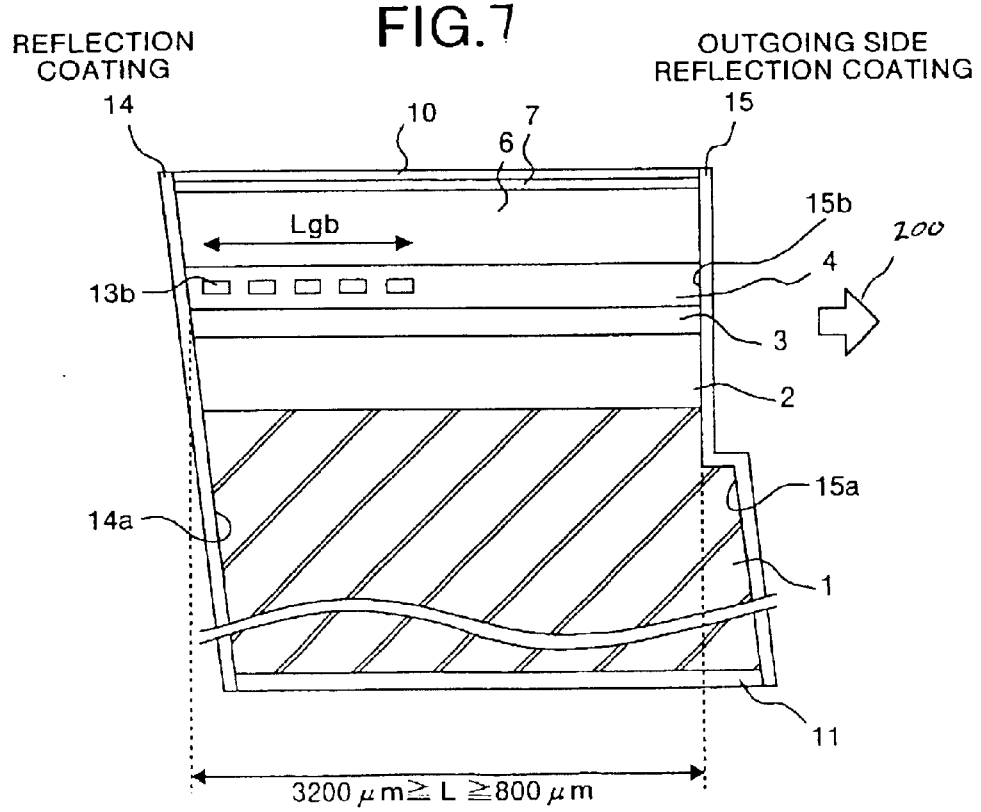
FIG. 7 is a vertical sectional view in the longitudinal direction of a semiconductor laser device in accordance with a second embodiment of the present invention.

FIG. 7 is a vertical sectional view in the longitudinal direction of a semiconductor laser device having a diffraction grating and offset facet on the light reflecting side of the device in accordance with a second embodiment of the present invention. As seen in this figure, the diffraction grating 13b is provided in the vicinity of the reflection film 14. With such a configuration, it is preferable that the diffraction grating length Lgb and the resonator length L are set to satisfy the relationship Lg≦½L. Moreover, the diffraction grating 13b is preferably constructed such that a value obtained by multiplying a coupling coefficient κ of the diffraction grating by a diffraction grating length Lg is set to 1 or more, and selectively returns light to the radiation side by the reflection coefficient of 98% or higher. Examples of devices having a diffraction grating provided in the vicinity of the radiation side reflecting film may be found in U.S. patent application Ser. No. 09/983,175, which is incorporated herein by reference.

As also seen in FIG. 7, a plane 14a formed by the light reflecting end of the laser device is inclined with respect to the longitudinal direction of the semiconductor laser device along which light is emitted from the device as shown by the arrow 200. Moreover, on the light emitting end of the laser device, the substrate 1 has a planar surface 15a substantially parallel to the planar surface 14a, while buffer layer 2, active layer 3, spacer layer 4, cladding layer 6, contact layer 7 and electrode form a planar surface 15b substantially perpendicular to the light emitting direction of the laser device 20. Therefore, the reflectance of the outgoing side end face is determined by the total reflectance obtained by the plane of cleavage 15b and the outgoing side reflection coating 15. This total reflectance is desirably about less than 1.5%. As with the first embodiment, the (100) crystal plane of the substrate 1 is 6° offset from the light output direction, and therefore, offset planes 14a and 15a are offset by 6° from a plane perpendicular to the light output, thereby significantly reducing the reflectance of plane 14a. However, by setting the product of the coupling coefficient κ and the diffraction grating length Lgb of the diffraction grating 13b to an adequate value, as described above, almost all laser beams can be reflected by the diffraction grating 13b itself. Hence, even if the facet of the reflection coating 14 side is inclined by the angle of the off angle, the laser beam can be sufficiently reflected.

Figure 8:
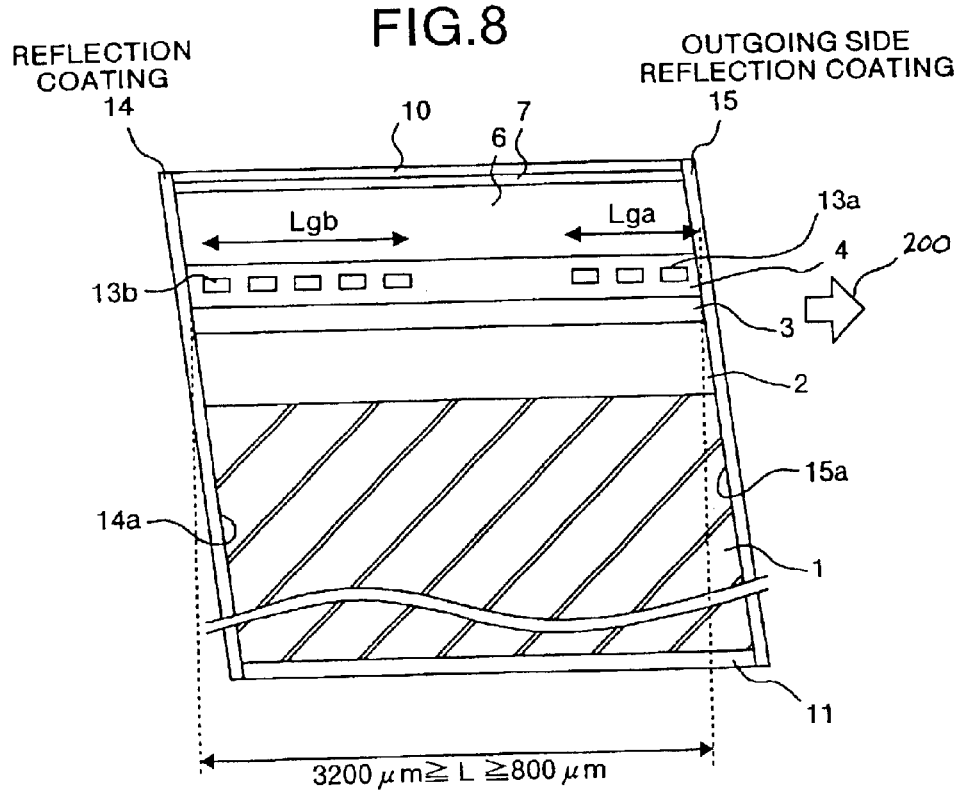
FIG. 8 is a vertical sectional view in the longitudinal direction of a semiconductor laser device in accordance with a third embodiment of the present invention.

FIG. 8 is a vertical sectional view in the longitudinal direction of a semiconductor laser device having a diffraction grating and inclined facet on both the light reflecting side and the light emitting side of the device in accordance with the third embodiment of the present invention. In this case, a bi-directional effect of the semiconductor laser device shown in FIG. 1 and the semiconductor laser device shown in FIG. 7 can be obtained. That is to say, in this second embodiment, almost all laser beams can be reflected by the diffraction grating 13b itself, by setting the product of the coupling coefficient κ and the diffraction grating length Lgb of the diffraction grating 13b to an adequate value. Hence, the plane of cleavage 13b of the reflecting side end face can keep the off angle and a step of forming an etching area 25 can be omitted. Moreover, it is noted that the formation of the diffraction grating Lgb can be performed simultaneously with the formation of the diffraction grating Lga.

As a result, while satisfying the wavelength selection option by means of the diffraction gratings 13a and 13b, the influence of the Fabry-Perot resonator due to the reflection coating 14 and the outgoing side reflection coating 15 can be reduced, and unnecessary oscillation in the Fabry-Perot mode can be suppressed. Furthermore, the emission wavelength can be selected by the diffraction gratings 13a and 13b, to stabilize the laser oscillation and increase the laser output efficiency, and a laser beam having a desired emission wavelength can be efficiently output.

Figure 9:
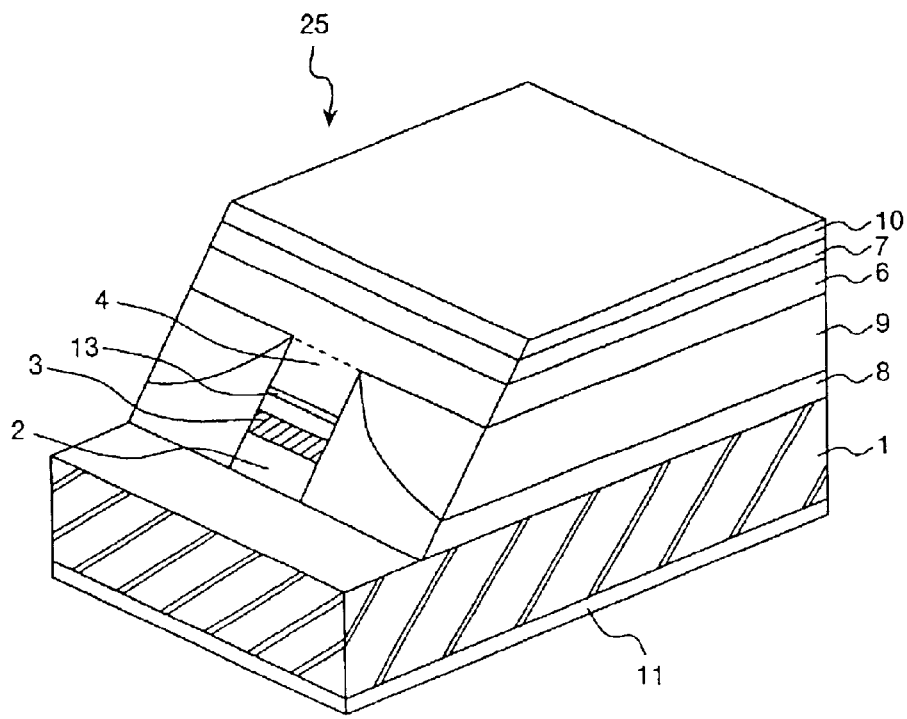
FIG. 9 is a perspective view of a semiconductor laser device having an offset angle in accordance with the present invention that is formed by an etching process.

Each of the previously described embodiments have provided a vertically offset facet by way of an offset cleavage plane of the multilayer structure. However, the vertically offset facet may be provided by an etching method according to the present invention. FIG. 9 is a perspective view of a semiconductor laser device having a vertical offset that is formed by an etching process angle in accordance with the present invention. As seen in this figure, the semiconductor laser device 25 includes an n-InP substrate 1 having an n-InP buffer layer 2, an active layer 3, a p-InP spacer layer 4, a p-InP cladding layer 6, and an InGaAsP contact layer 7, as well as blocking layers 8 and 9 sequentially stacked on a face of the substrate 1. In addition, a diffraction grating 13 of a p-InGaAsP material is periodically formed within the p-InP spacer layer, a p-side electrode 10 is formed on the upper surface of InGaAsP cap layer 7, and an n-side electrode 11 is formed on the lower surface of n-InP substrate 1.

As seen in FIG. 9, the offset facet is provided for the multilayer structure other than the substrate 1. Specifically, buffer layer 2 (as well as blocking layers 8 and 9), active layer 3, spacer layer 4, cladding layer 6, and an InGaAsP contact layer 7 are etched by an anisotropic etching process in which selection ratio of etching is reduced. That is, this multiplayer structure is grown such that an etching axis is 6° vertically offset from a plane perpendicular to the light output direction. Using such a process, it is possible to control the inclination angle of the light radiation end surface by controlling the selection ratio and anisotropy of the etching, thereby forming the vertically offset facet. It is noted that this method of offsetting the facet does not cause a degradation of optical characteristics for off angles greater than 15°, as was described in the offset cleaving axis embodiment above. The etched offset facet provides a reduced reflectivity of the light emitting facet thereby suppressing unnecessary oscillation in the Fabry-Perot mode resulting in stable oscillation and an increase in laser output efficiency.

Figure 10A:
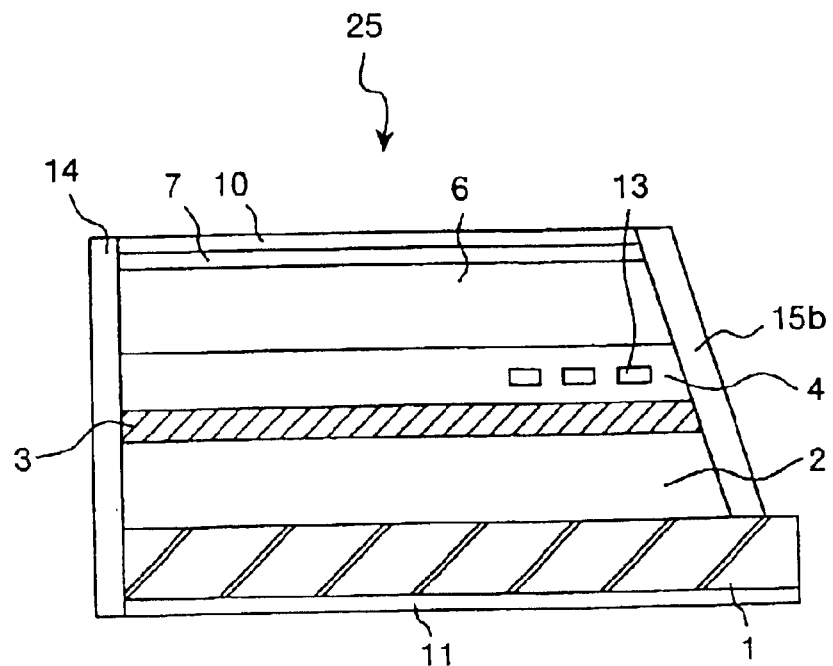
FIGS. 10A and 10B are vertical sectional views in the longitudinal direction of alternative embodiments of the semiconductor laser device formed by an etching process.
Figure 10B:
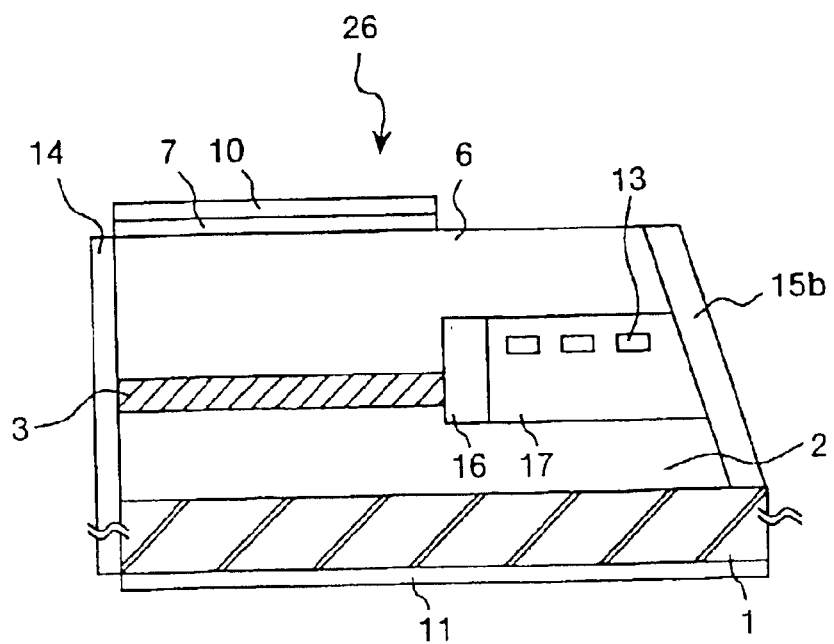

FIGS. 10A and 10B are vertical sectional views in the longitudinal direction of alternative embodiments of the semiconductor laser device formed by an etching process. As seen in FIG. 10A, the diffraction grating 13 is partially provided along the GRIN-SCH-MQW active layer 3 similar to the embodiment of FIG. 1. Moreover, FIG. 10B, the diffraction grating is formed along an optical waveguide of the semiconductor device. In the semiconductor laser device 26 shown in FIG. 10B, an optical waveguide layer 16 and an optical waveguide layer 17 including the diffraction grating are sequentially disposed in the longitudinal direction (laser beam emitting direction) from the GRIN-SCH-MQW active layer 3 similar to the embodiment of FIG. 6. As a result, the reflectivity of the inclined facets of FIGS. 10A and 10B are reduced and unnecessary oscillation in the Fabry-Perot mode can be suppressed resulting in an increase in laser output efficiency. It is also noted the process of etching the offset facet may be used to provide an offset light reflecting and/or light emitting facet as previously described.

Figure 11:
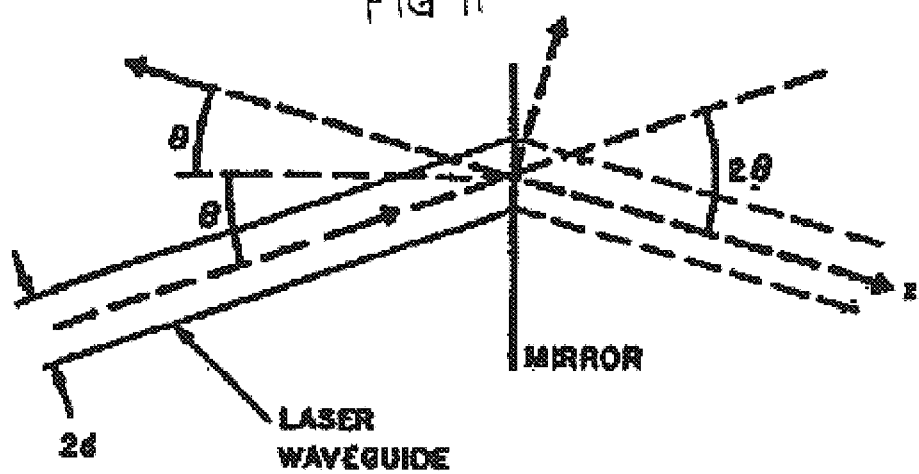
FIG. 11 is a calculation model illustrating the parameters used for calculating the effective reflectivity of the offset facet.

In each of the above described embodiments of the invention, the off angle of the light emitting or light reflecting plane has been designated as 6°; however, the present invention is not limited thereto. For example, the present inventors have discovered that the benefits of the present invention may be realized when the angle of the off angle is 3° or more. However, where the offset is provided by cleaving, the offset cannot exceed 15° for reasons noted above. FIG. 11 is a calculation model illustrating the parameters used for calculating the effective reflectivity of the offset facet. The figure is a sketch of a laser waveguide terminated by a tilted mirror and is taken from the article "Reflection Loss of Laser Mode From Tilted End Mirror", D. Marcuse, PP. 336–339, Journal of Lightwave technology Vol.7, No.2, February 1989, the entire contents of which is incorporated herein by reference.

Effective reflectivity is calculated from the power reflection coefficient Rg equation:

$$R_g = R_f(\theta)x \times \left[\frac{WU^2\left\{[W^2 - (\beta\theta d)^2]\frac{\sin(2\beta\theta d)}{2\beta\theta d} + W\cos(2\beta\theta d)\right\}}{(1+W)[U^2 - (\beta\theta d)^2][W^2 + (\beta\theta d)^2]}\right]^2 \quad (1)$$

where Rf is the Fresnel reflection coefficient of a plane wave that is reflected from the tilted dielectric interface between the laser crystal and air, and β is the propagation constant. The parameters U and W are, respectively, the normalized propagation constants of the wave in the slab core of the laser having a width 2d $$U = \sqrt{n_1^2 k^2 - \beta^2} d \quad (2)$$

and the normalized transfer decay parameter $$W = \sqrt{\beta^2 - n_2^2 k^2} d \quad (3)$$

where k is the free space wave number k=2Π/λ (λ=free space wavelength).

A core of the width 2d was estimated from following formula:

$$d = \frac{\lambda}{\pi \cdot \left(\tan\left(\frac{FFP_v}{\sqrt{2\ln 2}}\right)\right)} \quad (4)$$

where, FFPv represents the vertical angle of far field pattern. An FFP of 18°–24° is required in order to achieve high power operation for the laser device.

Using these equations, λ was set to be 1480 nm, and n1 of 3.19 and n2 of 3.18 were used for the effective refractive index of an active region corresponding to a slab core and InP cladding, respectively. A propagation constant β of 13.56 was estimated from a laser structure by calculation. However, it is noted that parameters, such as effective refractive index and propagation constant, depend on the structure of the active layer and the oscillation wavelength.

Figure 12:
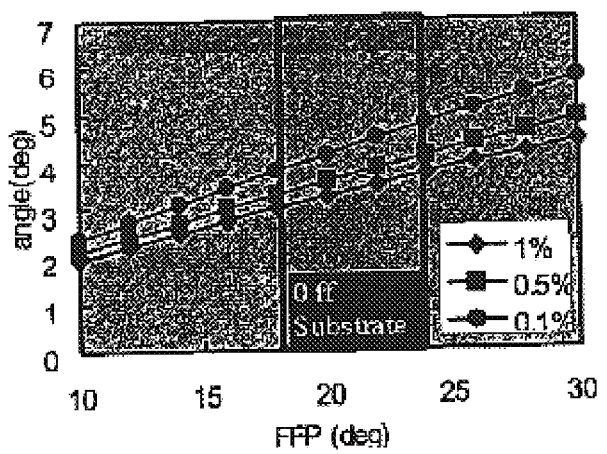
FIG. 12 is a graph showing the relation between the off-angle of a facet and the FFP to get a desired reflectivity.

FIG. 12 is a graph showing the relation between the off-angle of a facet and the FFP to get a desired reflectivity. As noted above, the FFP is limited to the range of 18–24 degrees in order to provide high power operation of the laser device. Thus, as seen in FIG. 12, a range of off angles may be used to satisfy a particular reflectivity over the limited range of FFP. Specifically, a 1% reflectivity is obtained at the range of off-angle of 3–3.7 degrees and a 0.5% reflectivity is obtained at the range of off-angle of 3.3–4.1 degrees. The preferred reflectivity of 0.1% reflectivity is obtained at the range of off-angle of 3.8–4.8 degrees. Thus, an off-angle of no less than 3 degrees is required to get below 1% reflectivity. More preferably, no less than 3.8 degrees is required to get below 0.1%.

Figure 13:
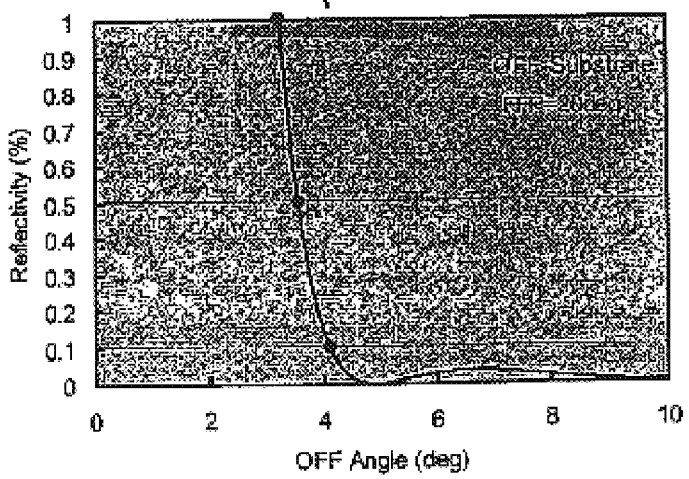
FIG. 13 is a graph showing the effective reflectivity as a function of an off-angle of the substrate for an FFPv of 20°.

FIG. 13 is a graph showing the effective reflectivity as a function of an off-angle of the substrate for an FFPv of 20°. As seen in this figure, a vertical offset angle of about 4 degrees and larger angle enables the reflectivity to control below 0.1%.

Finally, in each of the embodiments described above, the periodically spaced material of the diffraction grating 13 is equally spaced and has a constant period of the diffraction grating. However, it is to be understood that the grating material may have different spacings and pitches in order to achieve the desired multiple oscillation modes output from the laser device.

Figure 14:
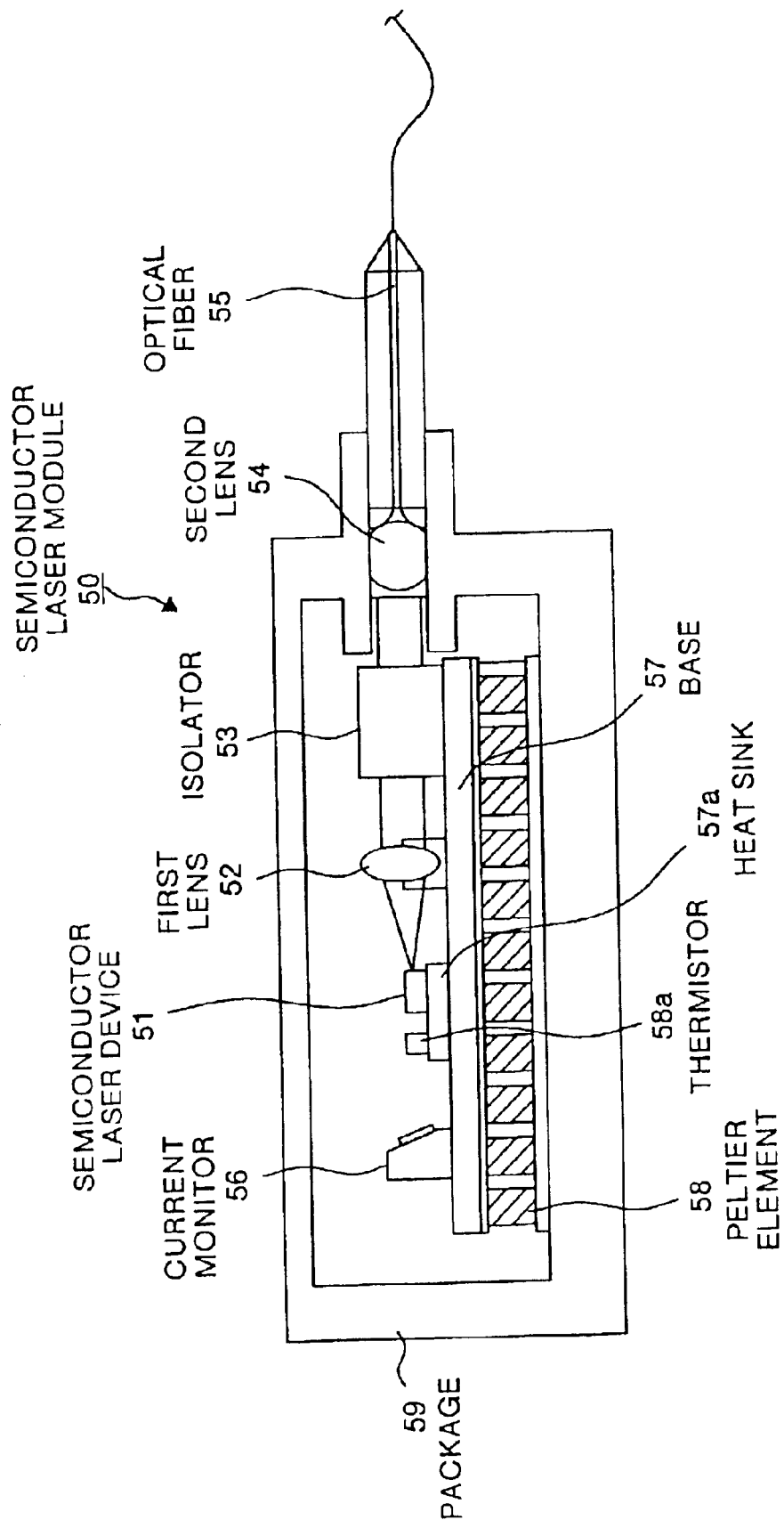
FIG. 14 is a vertical sectional view illustrating the configuration of a semiconductor laser module having a semiconductor laser device according to the present invention.

FIG. 14 is a vertical sectional view illustrating the configuration of a semiconductor laser module having a semiconductor laser device according to the present invention. The semiconductor laser module 50 includes a semiconductor laser device 51, a first lens 52, an internal isolator 53, a second lens 54 and an optical fiber 55. Semiconductor laser device 51 is an integrated grating device configured in accordance with any of the above-described semiconductor laser devices and a laser beam irradiated from the semiconductor laser device 51 is guided to optical fiber 55 via first lens 52, internal isolator 53, and second lens 54. The second lens 54 is provided on the optical axis of the laser beam and is optically coupled with the optical fiber 55.

The semiconductor laser device 51 is preferably provided in a junction down configuration in which the p-side electrode is joined to the heat sink 57a, which is mounted on the base 57. A back face monitor photo diode 56 is also disposed on a base 57 which functions as a heat sink and is attached to a temperature control device 58 mounted on the metal package 59 of the laser module 50. The back face monitor photo diode 56 acts as a current monitor to detect a light leakage from the reflection coating side of the semiconductor laser device 51.

The temperature control device 58 is a Peltier module. Although current (not shown) is given to the Peltier module 58 to perform cooling and heating by its polarity, the Peltier module 58 functions mainly as a cooler in order to prevent an oscillation wavelength shift by the increase of temperature of the semiconductor laser device 51. That is, if a laser beam has a longer wavelength compared with a desired wavelength, the Peltier element 58 cools the semiconductor laser device 51 and controls it at a low temperature, and if a laser beam has a shorter wavelength compared with a desired wavelength, the Peltier element 58 heats the semiconductor laser device 51 and controls it at a high temperature. By performing such a temperature control, the wavelength stability of the semiconductor laser device can improved. Alternatively, a thermistor 58a can be used to control the characteristics of the laser device. If the temperature of the laser device measured by a thermistor 58a located in the vicinity of the laser device 51 is higher, the Peltier module 58 cools the semiconductor laser device 51, and if the temperature is lower, the Peltier module 58 heats the semiconductor laser device 51. By performing such a temperature control, the wavelength and the output power intensity of the semiconductor laser device are stabilized.

Figure 15:
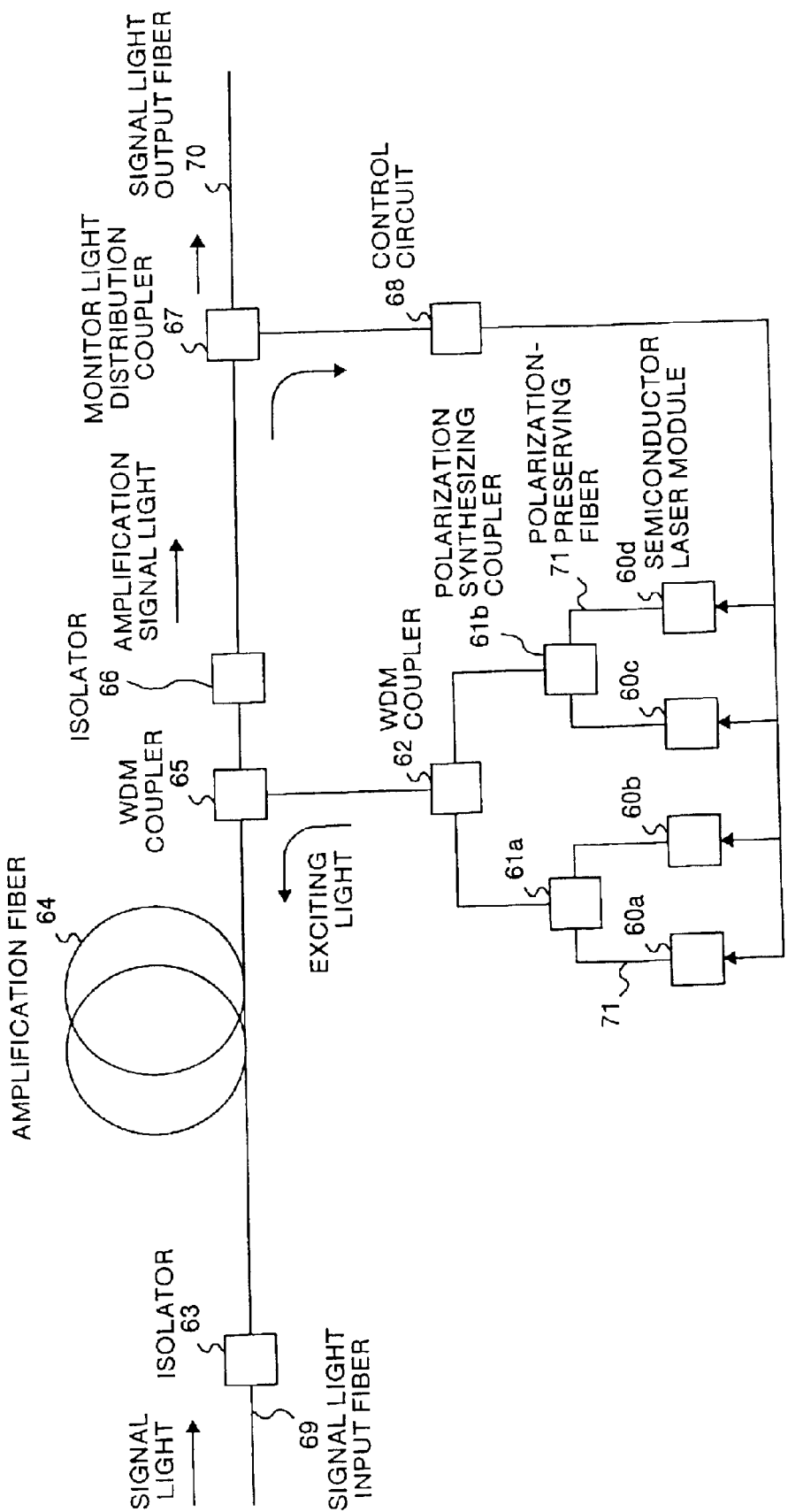
FIG. 15 is a block diagram illustrating a configuration of a Raman amplifier used in a WDM communication system in accordance with the present invention.

In FIG. 15, semiconductor laser modules 60a through 60d are of the type described in the embodiment of FIG. 14. The laser modules 60a and 60b output laser beams having the same wavelength via polarization maintaining fiber 71 to polarization-multiplexing coupler. Similarly, laser beams outputted by each of the semiconductor laser modules 60c and 60d have the same wavelength, and they are polarization-multiplexed by the polarization-multiplexing coupler 61b. Each of the laser modules 60a through 60d outputs a laser beam having a plurality of oscillation longitudinal modes in accordance with the present invention to a respective polarization-multiplexing coupler 61a and 61b via a polarization maintaining fiber 71.

Polarization-multiplexing couplers 61a and 61b output polarization-multiplexed laser beams having different wavelengths to a WDM coupler 62. The WDM coupler 62 multiplexes the laser beams outputted from the polarization multiplexing couplers 61a and 61b, and outputs the multiplexed light beams as a pumping light beam to amplifying fiber 64 via WDM coupler 65. Signal light beams to be amplified are input to amplifying fiber 64 from signal light inputting fiber 69 via isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light beams as an output laser beam to signal light outputting fiber 70.

The control circuit 68 controls a light-emitting state, for example, an optical intensity, of each of the semiconductor laser module 60a through 60d based on the portion of the amplified signal light beams input to the control circuit 68. This optical intensity of the Raman amplifier output is used along with the monitor current photodiode 56 of the laser module in FIG. 26 to control the output of the semiconductor lasers of each module. Thus, control circuit 68 performs feedback control of a gain band of the Raman amplification such that the gain band will be flat over wavelength.

Figure 16:
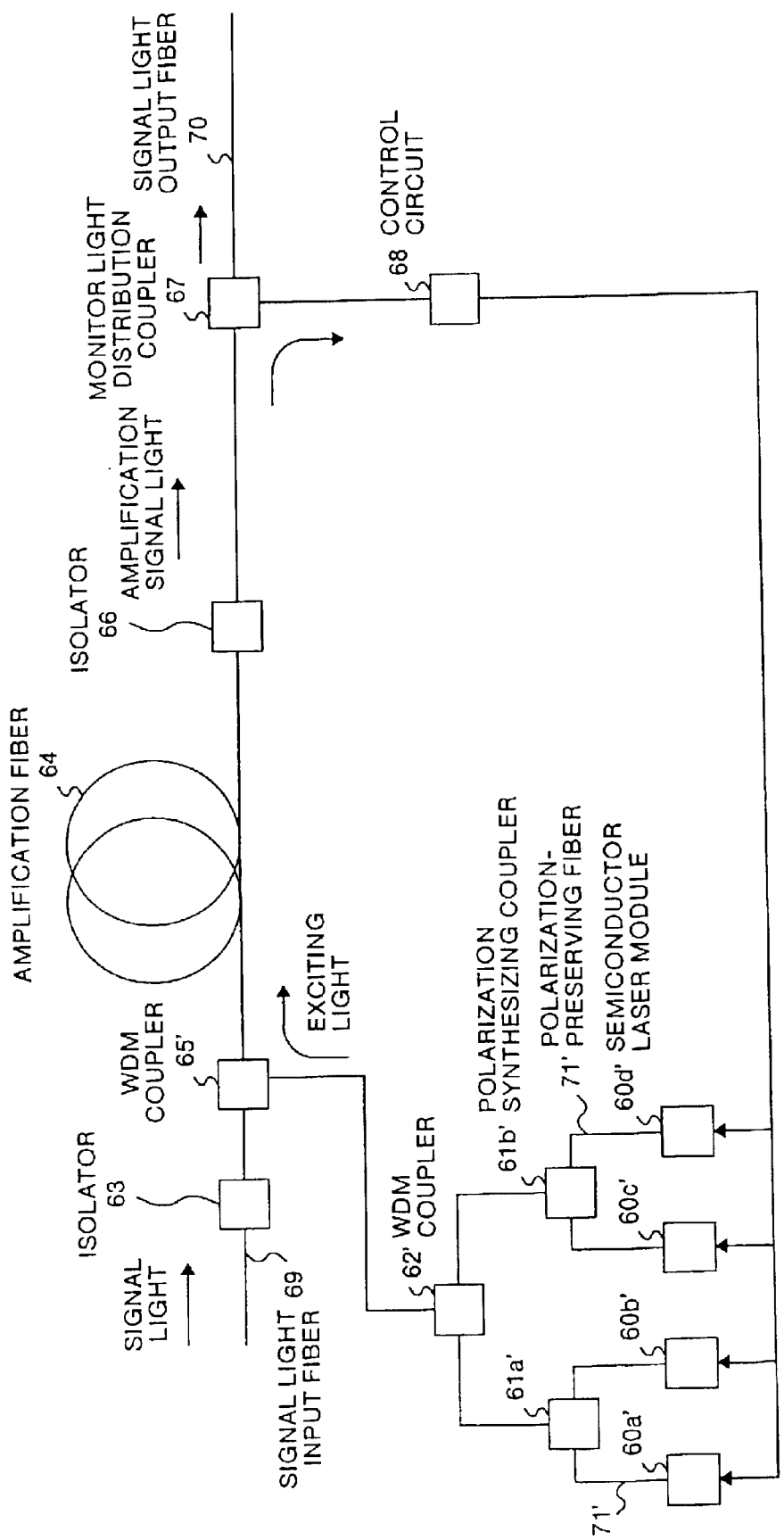
FIGS. 16 and 17 show a block diagram illustrating a configuration of the Raman amplifier of FIG. 15, used in a WDM communication system in a forward and bidirectional pumping method respectively, in accordance with the present invention.
Figure 17:
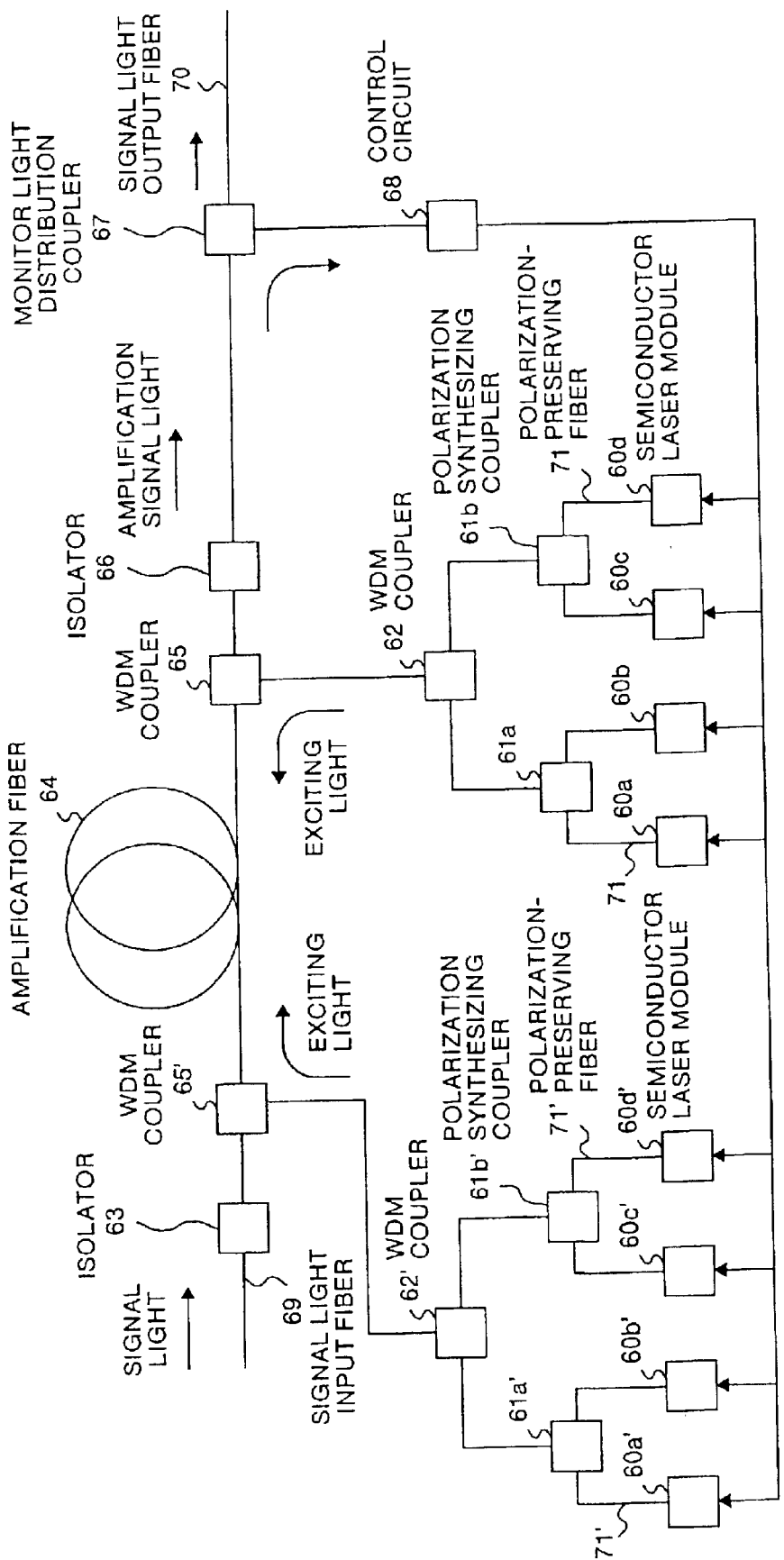
Figure 18:
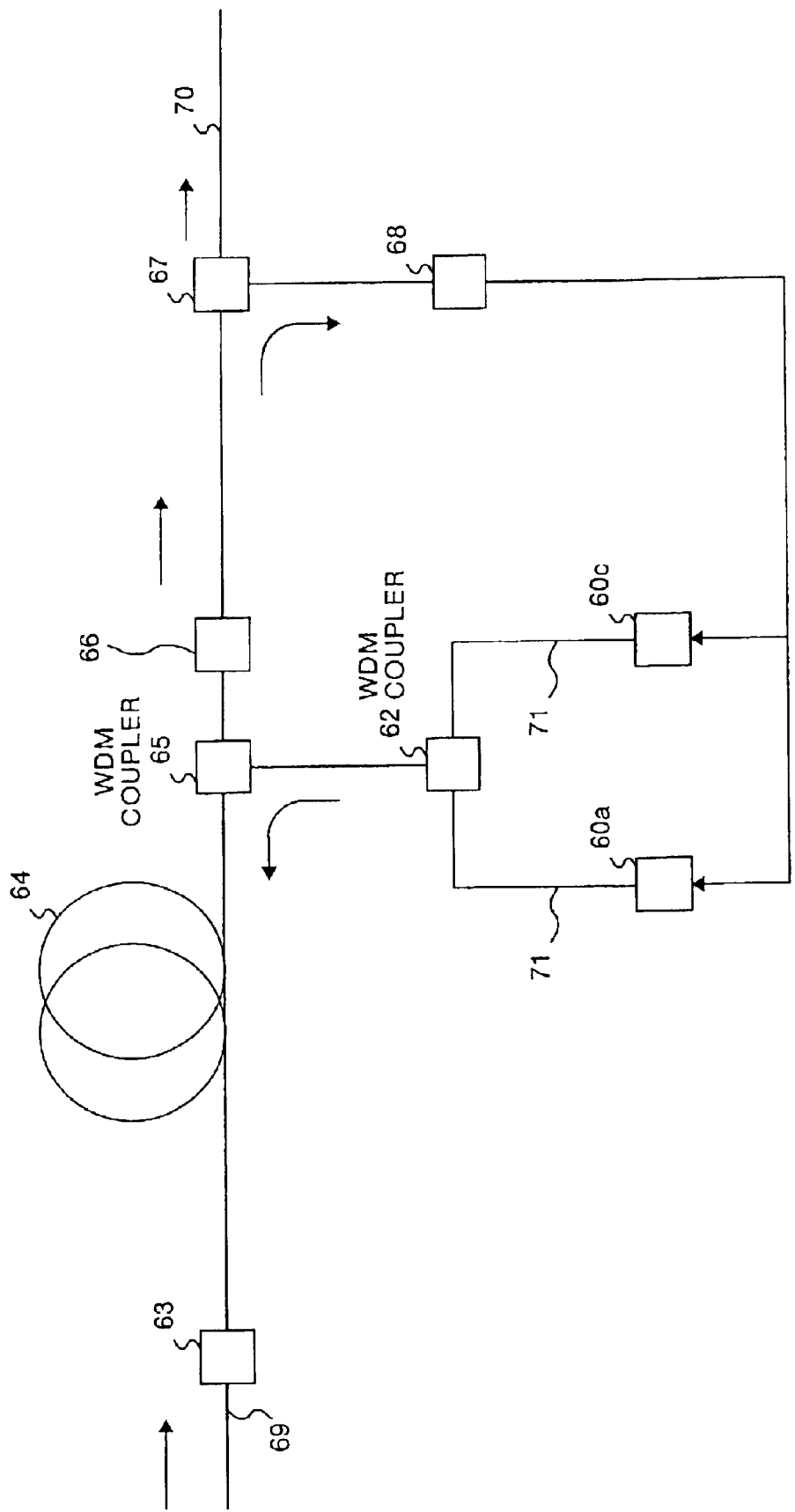
FIG. 18 is a block diagram illustrating a configuration of a Raman amplifier in which polarization dependency gain is suppressed by depolarizing a pumping light beam output from a single semiconductor laser device using polarization maintaining fibers as a depolarizer, in accordance with an embodiment of the present invention.
Figure 17:
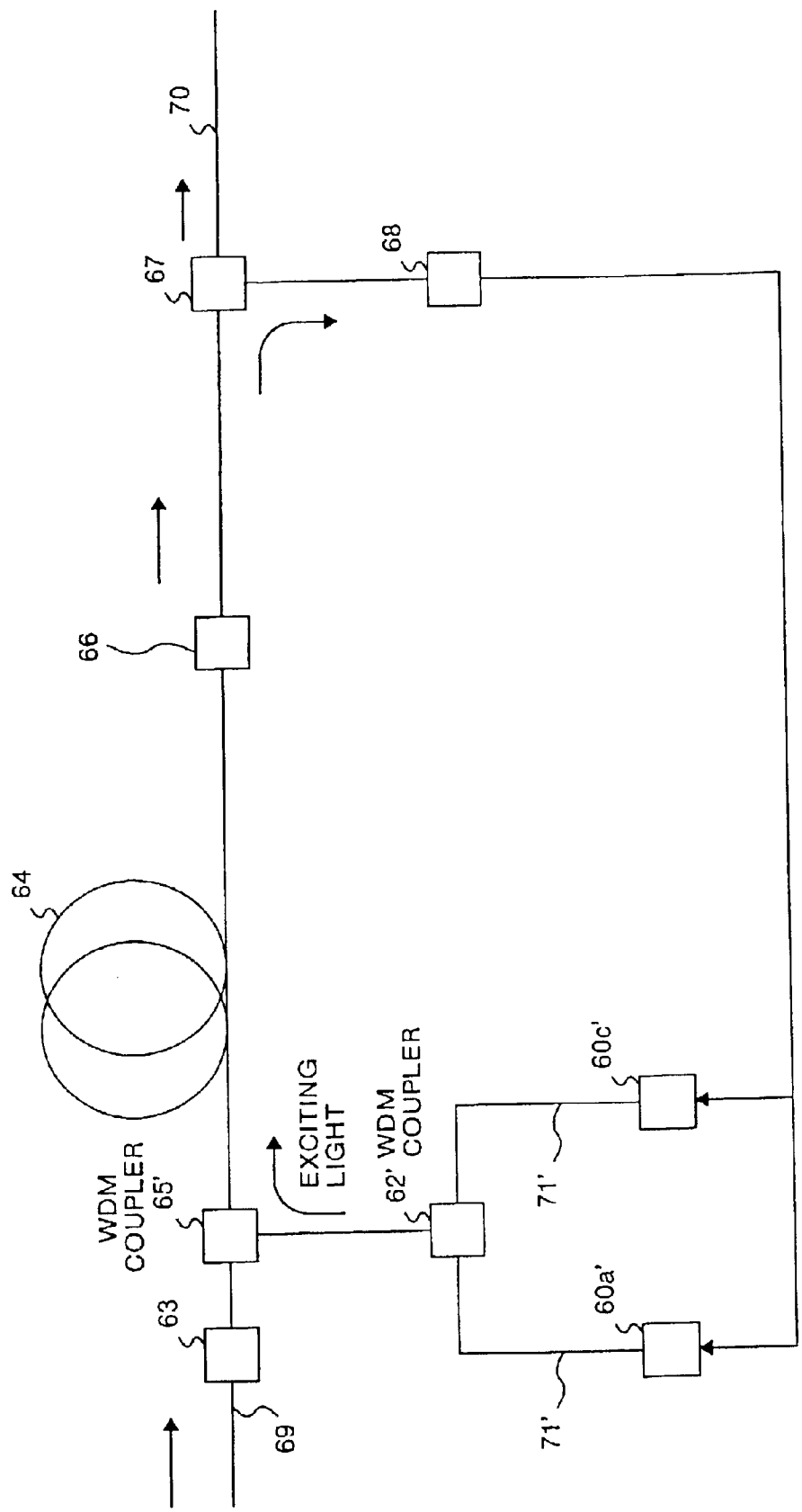

Although the Raman amplifier illustrated in FIG. 15 is the backward pumping method, it is to be understood that the semiconductor laser device, module and Raman amplifier of the present invention may be used with a forward pumping method as shown in FIG. 16, or the bi-directional pumping method as shown in FIG. 17. Moreover, the Raman amplifier can be constructed by wavelength-multiplexing of a plurality of pumping light sources which are not polarization-multiplexed. That is, the semiconductor laser module of the present invention can be used in a Raman amplifier where the polarization-multiplexing of pumping light is not performed. FIG. 18 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention. As seen in this figure, laser modules 60A and 60C are directly connected to WDM coupler 62 via a polarization maintaining fiber 71. In this configuration, the angle of the polarization axis of the polarization maintaining fiber against the emitted light from semiconductor laser device is approximately 45 degrees. Finally, it is to be understood that the semiconductor laser device, module and Raman amplifier of the present invention shown in FIG. 16 may be used with a forward pumping method as shown in FIG. 19, or the bi-directional pumping method as shown in FIG. 20.

Figure 21:
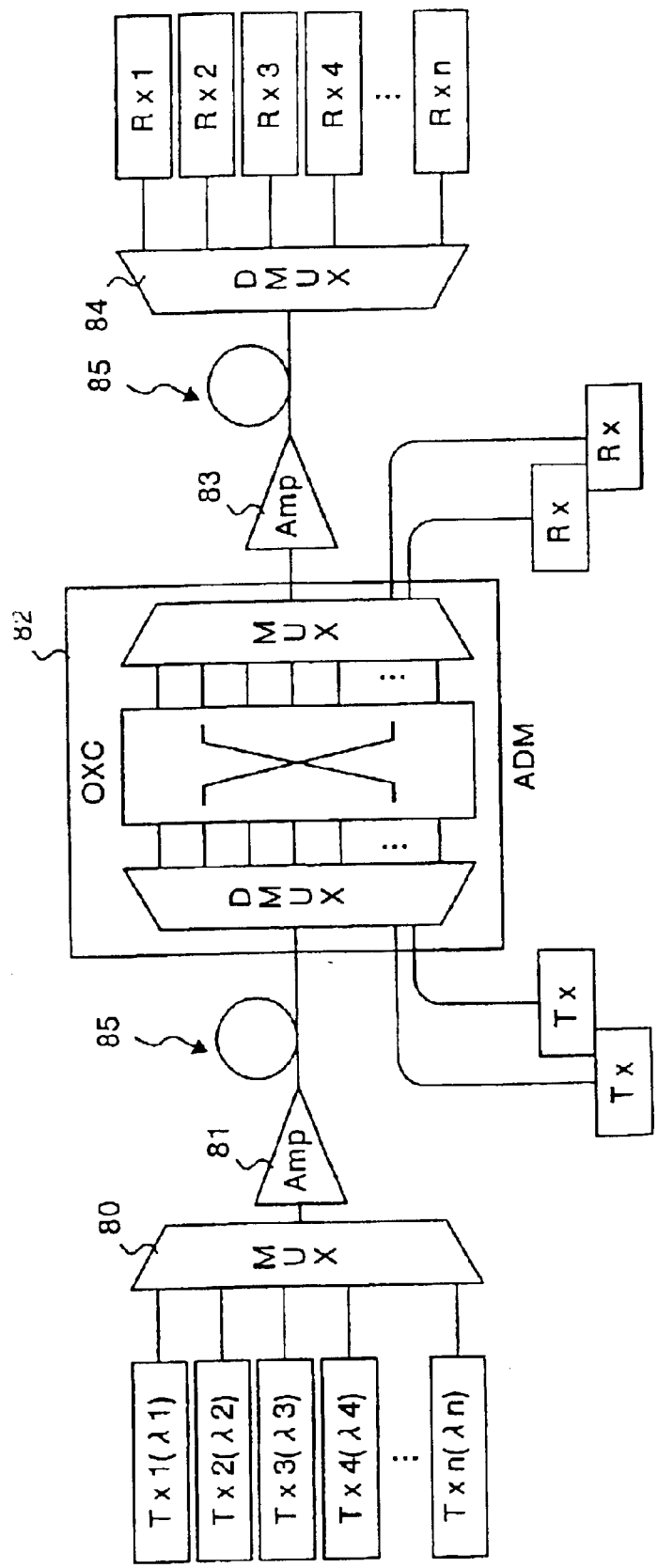
FIG. 21 is a block diagram illustrating a general configuration of the WDM communication system to which the Raman amplifier shown in any of FIGS. 15–20 is applied.

The Raman amplifier illustrated in FIGS. 15–20 can be applied to the WDM communication system as described above. FIG. 21 is a block diagram illustrating a general configuration of the WDM communication system to which the Raman amplifier shown in any of FIGS. 15–20 is applied.

In FIG. 21, optical signals of wavelengths $\lambda_1$ through $\lambda_n$ are forwarded from a plurality of transmitter $Tx_1$ through $Tx_n$ to multiplexing coupler 80 where they are wavelength-multiplexed and output to optical fiber 85 line for transmission to a remote communications unit. On a transmission route of the optical fiber 85, a plurality of Raman amplifiers 81 and 83 corresponding to the Raman amplifier illustrated in FIG. 21 or FIG. 22 are disposed amplifying an attenuated optical signal. A signal transmitted on the optical fiber 85 is divided by an optical demultiplexer 84 into optical signals of a plurality of wavelengths $\lambda_1$ through $\lambda_n$, which are received by a plurality of receivers $Rx_1$ through $Rx_n$. Further, an ADM (Add/Drop Multiplexer) may be inserted on the optical fiber 85 for inserting and removing an optical signal of an arbitrary wavelength.

Obviously, numerous modifications and variations of the present invention are possible in light of the above teachings. It is therefore to be understood that within the scope of the appended claims, the invention may be practiced otherwise than as specifically described herein. For example, the present invention has been described as a pumping light source for the Raman amplification, it is evident that the configuration is not limited to this usage and may be used as an EDFA pumping light source of the oscillation wavelength of 980 nm and 1480 nm. Moreover, it is to be understood that the vertically offset facet may be offset to incline or decline with respect to a light output direction.

What is claimed is:

1. A semiconductor laser device comprising:
   an active layer configured to radiate light;
   a light reflecting facet positioned on a first side of said active layer;
   a light emitting facet positioned on a second side of said active layer thereby forming a resonator between said light reflecting facet and said light emitting facet; and
   a diffraction grating positioned within said resonator along the length of said active layer, wherein said laser is configured to output a multiple mode laser beam and at least one of said light reflecting and light emitting facets is vertically offset by an offset angle with respect to a plane perpendicular to a light emitting direction of the device.

2. The semiconductor laser device of claim 1, wherein said at least one of said light reflecting and light emitting facets comprises a light emitting facet vertically offset by an off angle with respect to a plane perpendicular to a light emitting direction of the device.

3. The semiconductor laser device of claim 2, wherein said off angle of the light emitting facet is 3° or more.

4. The semiconductor laser device of claim 3, wherein said off angle of the light emitting facet is approximately 6°.

5. The semiconductor laser device of claim 2, wherein said light emitting facet comprises a reflectance coating that provides a reflectivity of approximately 10%, approximately 5%, approximately 1%, approximately 0.5%, or approximately 0.1%.

6. The semiconductor laser device of claim 5, wherein said off angle is a value necessary to provide an effective reflectivity of the light emitting facet at a value less than 1%.

7. The semiconductor laser device of claim 5, wherein said off angle is a value necessary to provide an effective reflectivity of the light emitting facet at a value less than 0.1%.

8. The semiconductor laser device of claim 2, wherein said light reflecting facet comprises:
   a first plane substantially perpendicular to a light emitting direction of the laser device, and
   a second plane substantially parallel to said vertically offset light emitting facet.

9. The semiconductor laser device of claim 2, wherein said diffraction grating is a partial diffraction grating positioned along a portion of said active layer in the vicinity of said light emitting facet.

10. The semiconductor device of claim 9, wherein a length of said partial diffraction grating and a length of said resonator are set to meet the inequality:

$$Lg \times (1300/L) \leq 300,$$

where Lg is the predetermined length of the partial diffraction grating in $\mu$m, and
L is the length of the resonator in $\mu$m.

11. The semiconductor device of claim 9, wherein a length and a coupling coefficient of said partial diffraction grating are set to meet the inequality:

$$\kappa \cdot Lg \leq 0.3,$$

where $\kappa$ is the coupling coefficient of the diffraction grating, and
Lg is the length of the diffraction grating in $\mu$m.

12. The semiconductor laser device of claim 1, wherein said at least one of said light reflecting and light emitting facets comprises a light reflecting facet vertically offset by an off angle with respect to a line perpendicular to a light emitting direction of the device.

13. The semiconductor laser device of claim 12, wherein said off angle of the light reflecting facet is 3° or more°.

14. The semiconductor laser device of claim 13, wherein said off angle of the light reflecting facet is approximately 6°.

15. The semiconductor laser device of claim 12, wherein said light reflecting facet comprises a reflectance coating.

16. The semiconductor-laser device of claim 15, wherein said off angle is a value necessary to provide an effective reflectivity of the light reflecting facet at a value less than 1%.

17. The semiconductor laser device of claim 15, wherein said off angle is a value necessary to provide an effective reflectivity of the light reflecting facet at a value less than 0.1%.

18. The semiconductor laser device of claim 12, wherein said light emitting facet comprises:
   a first plane substantially perpendicular to a light emitting direction of the laser device, and
   a second plane substantially parallel to said light emitting facet having an offset angle.

19. The semiconductor laser device of claim 12, wherein said diffraction grating is a partial diffraction grating positioned along a portion of said active layer in the vicinity of said light reflecting facet.

20. The semiconductor device of claim 19, wherein a length of said partial diffraction grating and a length of said resonator are set to meet the inequality:

$$Lg \leq \tfrac{1}{2}L,$$

where Lg is the predetermined length of the partial diffraction grating in $\mu$m, and
L is the length of the resonator in $\mu$m.

21. The semiconductor device of claim 19, wherein a length and a coupling coefficient of said partial diffraction grating are to meet the inequality:

$$\kappa \cdot Lg \geq 1,$$

where $\kappa$ is the coupling coefficient of the diffraction grating, and
Lg is the length of the diffraction grating.

22. The semiconductor laser device of claim 1, wherein said at least one of said light reflecting and light emitting facets comprises:
   a light reflecting facet vertically offset by an off angle with respect to a line perpendicular to a light emitting direction of the device; and a light emitting facet vertically offset by an off angle with respect to a line perpendicular to a light emitting direction of the device, and wherein said light emitting facet and said light reflecting facet are substantially parallel to one another.

23. The semiconductor laser device of claim 1, wherein said semiconductor laser device comprises a substrate having a crystal reference plane that is offset with respect to a plane formed by the light emitting direction of the semiconductor laser device.

24. The semiconductor laser device of claim 1 further comprising a light waveguide layer in which the diffraction grating is formed.

25. A method of providing a multiple mode laser output from a semiconductor laser device comprising:

radiating light from an active layer of the laser device;

providing a light reflecting facet positioned on a first side of said active layer and a light emitting facet positioned on a second side of said active layer thereby forming a resonator between said light reflecting facet and said light emitting facet;

providing a diffraction grating positioned within said resonator along a portion of the length of said active layer and configured to select said multiple mode laser output; and supressing Fabry-Perot oscillations by vertically offsetting at least one of said light reflecting and light emitting facets by an offset angle with to respect to a line perpendicular to a light emitting direction of the device.

26. The method of claim 25, wherein said suppressing Fabry-Perot oscillations comprises vertically offsetting said light emitting facet by an offset angle with respect to the line perpendicular to a light emitting direction of the device.

27. The method of claim 26, further comprising coating the light emitting facet with a reflective coating that provides a reflectivity of approximately 10%, approximately 5%, approximately 1%, approximately 0.5%, or approximately 0.1%.

28. The method of claim 26, wherein said vertically offsetting comprises vertically offsetting said light emitting facet such that an effective reflectivity of the light emitting facet is less than 1%.

29. The method of claim 26, wherein said vertically offsetting comprises vertically offsetting said light emitting facet such that an effective reflectivity of the light emitting facet is less than 0.1%.

30. The method of claim 25, wherein said suppressing Fabry-Perot oscillations comprises vertically offsetting said light reflecting facet by an offset angle with respect to the line perpendicular to a light emitting direction of the device.

31. The method of claim 30, further comprising coating the light reflecting facet with a reflective coating that provides a reflectivity of approximately 10%, approximately 5%, approximately 1%, approximately 0.5%, or approximately 0.1%.

32. The method of claim 30, wherein said vertically offsetting comprises vertically offsetting said light reflecting facet such that an effective reflectivity of the light reflecting facet is less than 1%.

33. The method of claim 30, wherein said vertically offsetting comprises vertically offsetting said light reflecting facet such that an effective reflectivity of the light reflecting facet is less than 0.1%.

34. The method of claim 25, wherein said vertically offsetting comprises vertically offsetting at least one of said light emitting and light reflecting facets by an offset angle that is determined based on a desired effective reflectivity and a far field pattern (FFP) angle.

35. The method of claim 34, further comprising vertically offsetting at least one of said light emitting and light reflecting facets by an offset angle of about 3° to about 3.7° to achieve the desired effective reflectivity of 1% for the FFP range of about 18°–24°.

36. The method of claim 34, further comprising vertically offsetting at least one of said light emitting and light reflecting facets by an offset angle of about 3.3° to about 4.1° to achieve the desired effective reflectivity of 0.5% for the FFP range of about 18°–24°.

37. The method of claim 34, further comprising vertically offsetting at least one of said light emitting and light reflecting facets by an offset angle of about 3.8° to about 4.8° to achieve the desired effective reflectivity of 0.1% for the FFP range of about 18°–24°.

38. The method of claim 25, wherein said suppressing Fabry-Perot oscillations comprises:

vertically offsetting said light emitting facet by an offset angle with respect to the line perpendicular to a light emitting direction of the device; and vertically offsetting said light reflecting facet by an offset angle with respect to the line perpendicular to a light emitting direction of the device.

39. The method of claim 25, further comprising forming a light waveguide layer in which the diffraction grating is formed.

40. A semiconductor device comprising:

means for radiating light from an active layer of said device;

means for oscillating said radiated light within the cavity and emitting a portion of said radiated light from the laser device as a multiple mode light output beam;

means for selecting said portion of said radiated light to be emitted by said semiconductor laser device; and means for suppressing Fabry-Perot oscillations of said means for oscillating.

41. A semiconductor laser module comprising:

a semiconductor laser device comprising:

an active layer configured to radiate light, a light reflecting facet positioned on a first side of said active layer, a light emitting facet positioned on a second side of said active layer thereby forming a resonator between said light reflecting facet and said light emitting facet, and a diffraction grating positioned within said resonator along the length of said active layer, wherein said laser device is configured to output a multiple mode laser beam at least one of said light reflecting and light emitting facets is vertically offset by an offset angle with respect to a line perpendicular to a light emitting direction of the device; and a wave guide device for guiding said laser beam away from the semiconductor laser device.

42. An optical fiber amplifier comprising:

a semiconductor laser device comprising:

an active layer configured to radiate light, a light reflecting facet positioned on a first side of said active layer, a light emitting facet positioned on a second side of said active layer thereby forming a resonator between said light reflecting facet and said light emitting facet, and a diffraction grating positioned within said resonator along the length of said active layer, wherein said laser device is configured to output a multiple mode laser beam and at least one of said light reflecting and light emitting facets is vertically offset by an offset angle with respect to a line perpendicular to a light emitting direction of the device; and an amplifying fiber coupled to said semiconductor laser device and configured to amplify a signal by using said light beam as an excitation light.

43. A wavelength division multiplexing system comprising:

a transmission device configured to provide a plurality of optical signals having different wavelengths;

an optical fiber amplifier coupled to said transmission device and including a semiconductor laser device comprising:

an active layer configured to radiate light, a light reflecting facet positioned on a first side of said active layer, a light emitting facet positioned on a second side of said active layer thereby forming a resonator between said light reflecting facet and said light emitting facet, and a diffraction grating positioned within said resonator along the length of said active layer, wherein said laser device is configured to output a multiple mode laser beam and at least one of said light reflecting and light emitting facets is vertically offset by an offset angle with respect a line perpendicular to a light emitting direction of the device; and a receiving device coupled to said optical fiber amplifier and configured to receive said plurality of optical signals having different wavelengths.

44. A Raman amplifier comprising:

a semiconductor laser device comprising:

an active layer configured to radiate light, a light reflecting facet positioned on a first side of said active layer, a light emitting facet positioned on a second side of said active layer thereby forming a resonator between said light reflecting facet and said light emitting facet, and a diffraction grating positioned within said resonator along the length of said active layer, wherein said laser device is configured to output a multiple mode laser beam and at least one of said light reflecting and light emitting facets is vertically offset by an offset angle with respect a line perpendicular to a light emitting direction of the device; and a fiber coupled to said semiconductor laser device and configured to carry a signal that is amplified based on said light beam being applied to said fiber.

45. The Raman amplifier of claim 44, wherein said semiconductor laser device is coupled to said fiber at an input side of said fiber such that said light beam is applied in a forward pumping method.

46. The Raman amplifier of claim 44, wherein said semiconductor laser device is coupled to said fiber at an output side of said fiber such that said light beam is applied in a backward pumping method.

47. The Raman amplifier of claim 44, wherein said semiconductor laser device is coupled to said fiber at both an input and output side of said fiber such that said light beam is applied in both a forward and backward pumping method.

48. The semiconductor laser device of claim 23, wherein said off angle is 3° or more and no more than 15°.

* * * * *